United States Patent [19]
Koyashiki et al.

[11] Patent Number: 5,684,423
[45] Date of Patent: Nov. 4, 1997

[54] VARIABLE DELAY CIRCUIT

[75] Inventors: Tsuyoshi Koyashiki, Kawasaki; Kohei Teruyama, Akishima, both of Japan

[73] Assignee: Fujitsu Limited, Kawasaki, Japan

[21] Appl. No.: 766,321

[22] Filed: May 28, 1996

Related U.S. Application Data

[63] Continuation of Ser. No. 654,783, May 29, 1996, abandoned, which is a continuation of Ser. No. 367,485, Dec. 30, 1994, abandoned, which is a continuation of Ser. No. 958,902, Oct. 9, 1992, abandoned.

[30] Foreign Application Priority Data

Oct. 9, 1991  [JP]  Japan ................................ 3-261971

[51] Int. Cl.⁶ .................................................. H03H 11/26
[52] U.S. Cl. ........................... 327/263; 327/270; 327/432
[58] Field of Search ........................................ 307/446, 448, 307/570, 601–603, 605; 326/108, 110; 327/432, 263, 269, 270

[56] References Cited

U.S. PATENT DOCUMENTS 5,111,085  5/1992  Stewart ..................................... 307/603

FOREIGN PATENT DOCUMENTS

| | | |
|---|---|---|
| 0 382 938 | 8/1990 | European Pat. Off. . |
| 61-52022 | 3/1986 | Japan . |
| 63-069315 | 3/1988 | Japan . |
| 63-189010 | 8/1988 | Japan . |
| 3-262318 | 11/1991 | Japan . |
| 88/08642 | 11/1988 | WIPO . |
| WO89/03614 | 4/1989 | WIPO . |

*Primary Examiner*—Margaret Rose Wambach
*Attorney, Agent, or Firm*—Staas & Halsey

[57] ABSTRACT

A variable delay circuit which includes a first power source line for supplying a first power source voltage, a second power source line for supplying a second power source voltage which is smaller than the first power source voltage, an input terminal for receiving an input signal, a selection terminal for receiving a selection signal, an output terminal for outputting an output signal which is delayed relative to the input signal, a pull-up circuit coupled between the first power source line and the output terminal for carrying out a pull-up operation based on the input signal which is received via the input terminal, and a pull-down circuit coupled between the output terminal and the second power source line for carrying out a pull-down operation based on the input signal which is received via the input terminal. The pull-up or pull-down circuit has a delay time which is variable in response to the selection signal which is received via the selection terminal.

16 Claims, 20 Drawing Sheets

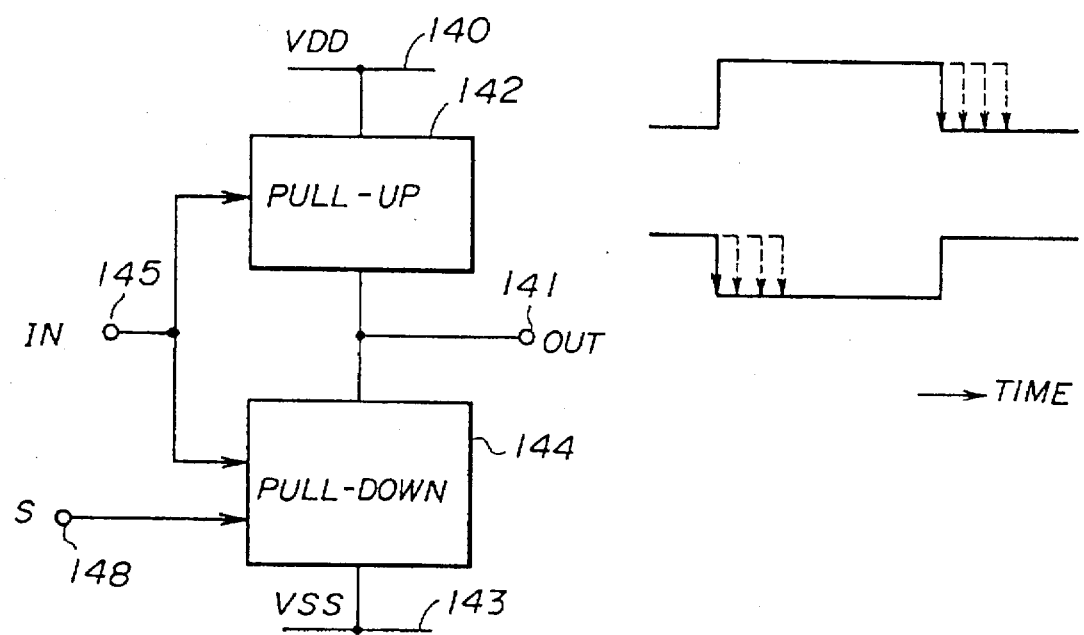
FIG. 3(a)
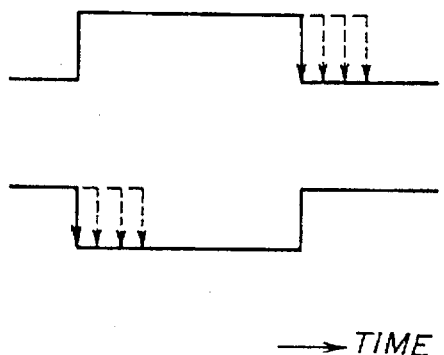
FIG. 3(b)
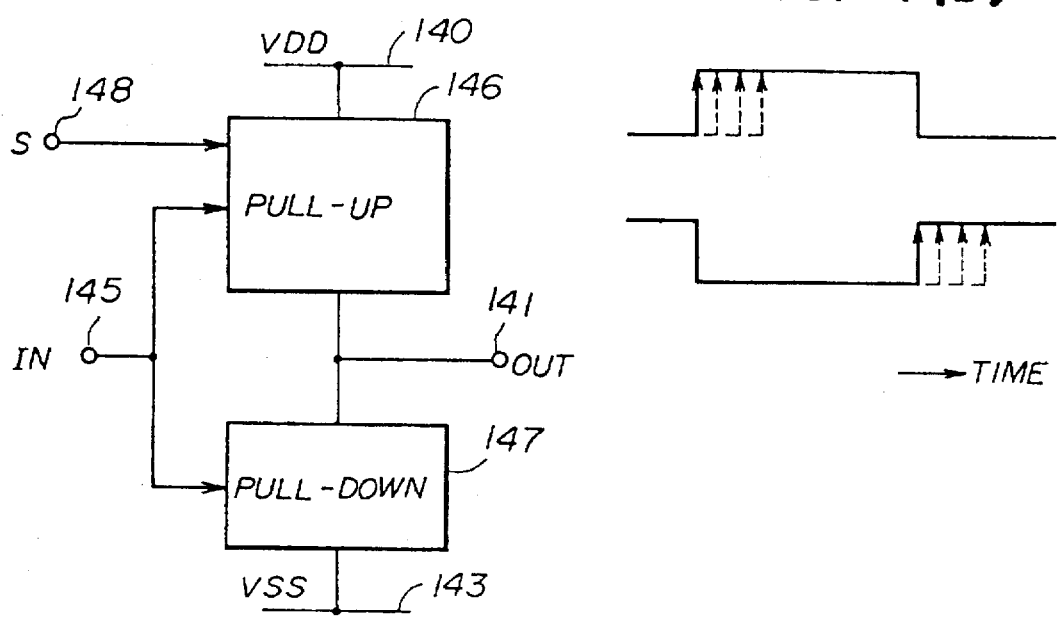
FIG. 4(a)
FIG. 4(b)

VARIABLE DELAY CIRCUIT

This application is a continuation of application Ser. No. 08/654,783, filed May 29, 1996, now abandoned, which, in turn, is a continuation of application Ser. No. 08/367,485 filed Dec. 30, 1994, now abandoned, and which, in turn, is a continuation of application Ser. No. 07/958,902 filed Oct. 9, 1992, now abandoned.

BACKGROUND OF THE INVENTION

The present invention generally relates to variable delay circuits, and more particularly to a variable delay circuit which is suited for use in a circuit requiring fine adjustment of the delay time.

FIG. 1 shows an example of a conventional variable delay circuit. This variable delay circuit includes gates 1, 2 and 3 which are coupled via wirings 4 and 5. The length of the wiring 4 is longer than that of the wiring 5 so that the stray capacitance of the wiring 4 is greater than that of the wiring 5. IN, S and OUT respectively denote an input signal, a selection signal and an output signal.

The gate 1 becomes conductive during a low-level period of the selection signal S and becomes non-conductive during a high-level period of the selection signal S. On the other hand, the gate 2 becomes conductive during the high-level period of the selection signal S and becomes non-conductive during the low-level period of the selection signal S. The gate 3 is conductive regardless of the level of the selection signal S.

If the low-level selection signal S is input to this variable delay circuit, the input signal IN passes through the gate 1, the wiring 4 and the gate 3 and is output as the output signal OUT. In addition, if the high-level selection signal S is input to this variable delay circuit, the input signal IN passes through the gate 2, the wiring 5 and the gate 3 and is output as the output signal OUT.

Accordingly, the lengths of the wirings 4 and 5 are determined so that a delay time of 550 ps, for example, is obtained when the selection signal S has the low level, and a delay time of 500 ps, for example, is obtained when the selection signal S has the high level.

FIG. 2 shows a case where a circuit for finely adjusting the delay time is formed by connecting ten variable delay circuits $6_1$ through $6_{10}$ respectively having the same construction as the variable delay circuit shown in FIG. 1. In FIG. 2, $S_1$ through $S_{10}$ respectively denote selection signals which are input to the variable delay circuits $6_1$ through $6_{10}$ and correspond to the selection signal S.

According to the circuit shown in FIG. 2, it is possible to obtain a minimum delay time of 5000 ps if the selection signals $S_1$ through $S_{10}$ all have the high level. On the other hand, it is possible to obtain a maximum delay time of 5500 ps if the selection signals $S_1$ through $S_{10}$ all have the low level. Furthermore, it is possible to make fine adjustments at a minimum of 50 ps interval between the delay times of 5000 ps and 5500 ps.

However, the variable delay circuit shown in FIG. 1 obtains the different delay time depending on the different lengths of the wirings 4 and 5. For this reason, there is a problem in that it is difficult to easily obtain a fine time difference, and the circuit for finely adjusting the delay time cannot be formed with ease.

Furthermore, it is conceivable to use one or more active elements for realizing delay times with fine time differences. In this case, it is possible to obtain fine time differences compared to the conventional case where gates are used, because the delay time introduced at each active element is extremely small. However, there is a problem in that the use of such active elements will introduce a voltage drop of the input signal. On the other hand, if the resistance of the active elements is selected such that the voltage drop is negligibly small, the delay time of the active elements becomes large and there is a problem in that it is impossible to obtain delay times with fine time differences.

SUMMARY OF THE INVENTION

Accordingly, it is a general object of the present invention to provide a novel and useful variable delay circuit in which the problems described above are eliminated.

Another and more specific object of the present invention is to provide a variable delay circuit comprising a first power source line for supplying a first power source voltage, a second power source line for supplying a second power source voltage which is smaller than the first power source voltage, an input terminal for receiving an input signal, selection terminal means for receiving a selection signal, an output terminal for outputting an output signal which is delayed relative to the input signal, a pull-up circuit, coupled between the first power source line and the output terminal, for carrying out a pull-up operation based on the input signal which is received via the input terminal, and a pull-down circuit, coupled between the output terminal and the second power source line, for carrying out a pull-down operation based on the input signal which is received via the input terminal, where the pull-down circuit has a delay time which is variable in response to the selection signal which is received via the selection terminal means. According to the variable delay circuit of the present invention, it is possible to easily obtain a plurality of delay times having fine time differences with respect to a low-level output signal.

Still another object of the present invention is to provide a variable delay circuit comprising a first power source line for supplying a first power source voltage, a second power source line for supplying a second power source voltage which is smaller than the first power source voltage, an input terminal for receiving an input signal, selection terminal means for receiving a selection signal, an output terminal for outputting an output signal which is delayed relative to the input signal, a pull-up circuit, coupled between the first power source line and the output terminal, for carrying out a pull-up operation based on the input signal which is received via the input terminal, and a pull-down circuit, coupled between the output terminal and the second power source line, for carrying out a pull-down operation based on the input signal which is received via the input terminal, where the pull-up circuit has a delay time which is variable in response to the selection signal which is received via the selection terminal means. According to the variable delay circuit of the present invention, it is possible to easily obtain a plurality of delay times having fine time differences with respect to a high-level output signal.

Other objects and further features of the present invention will be apparent from the following detailed description when read in conjunction with the accompanying drawings.

BRIEF DESCRIPTION OF THE DRAWINGS

FIG. 3 is a diagram for explaining a first aspect of the present invention;

FIG. 4 is a diagram for explaining a second aspect of the present invention;

DESCRIPTION OF THE PREFERRED EMBODIMENTS

Figure 1:
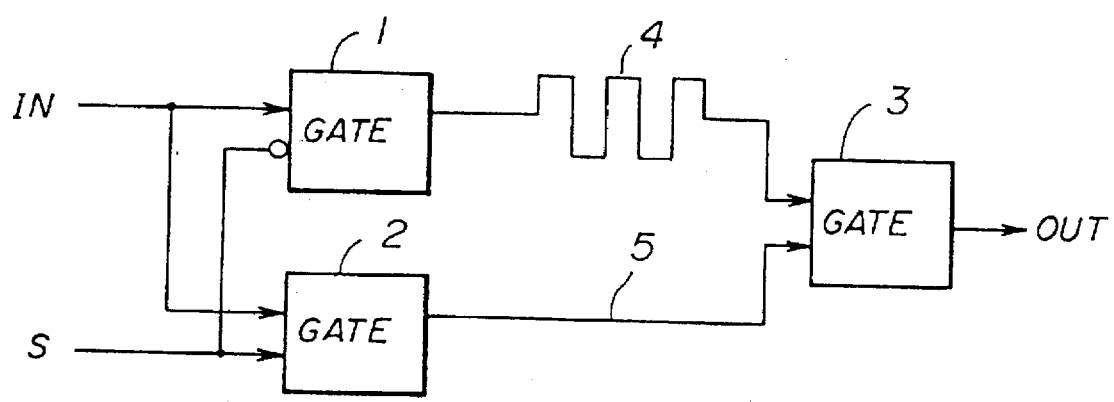
FIG. 1 is a system block digram showing an example of a conventional variable delay circuit.

First, a description will be given of first and second aspects of the present invention, that is, the operating principle of the present invention, by referring to FIGS. 3 and 4.

FIG. 3 shows the first aspect of the present invention. In FIG. 3(a), a pull-up circuit 142, which carries out a pull-up operation based on an input signal IN which is input to an input terminal 145, is coupled between a power source line 140 which supplies a power source voltage $V_{DD}$ and an output terminal 141. In addition, a pull-down circuit 144, which carries out a pull-down operation based on the input signal IN, is coupled between the output terminal 141 and a power source line 143 which supplies a power source voltage $V_{SS}$ that is lower than the power source voltage $V_{DD}$. This pull-down circuit 144 has a variable delay time which is set responsive to a selection signal S that is received via a terminal 148.

By the provision of the pull-down circuit 144, it is possible to select the delay time of the falling edge of an output signal OUT which is output via the output terminal 141 as shown in FIG. 3(b). It is possible to easily obtain a plurality of delay times having fine time differences.

FIG. 4 shows the second aspect of the present invention. In FIG. 4(a), a pull-up circuit 146, which carries out a pull-up operation based on the input signal IN which is input to the input terminal 145, is coupled between the power source line 140 which supplies the power source voltage $V_{DD}$ and the output terminal 141. In addition, a pull-down circuit 147, which carries out a pull-down operation based on the input signal IN, is coupled between the output terminal 141 and the power source line 143 which supplies the power source voltage $V_{SS}$ that is lower than the power source voltage $V_{DD}$. The pull-up circuit 146 has a variable delay time which is set responsive to the selection signal S received via the terminal 148.

By the provision of the pull-up circuit 146, it is possible to select the delay time of the rising edge of the output signal OUT which is output via the output terminal 141 as shown in FIG. 4(b). It is possible to easily obtain a plurality of delay times having fine time differences.

According to the present invention, it is possible to obtain delay times with fine time differences without causing an undesirable voltage drop of the input signal IN, even though active elements are used.

Of course, it is possible to provide both the pull-down circuit 144 and the pull-up circuit 146 respectively having the variable delay times. However, in order to simplify the circuitry, it is desirable to simply invert the output signal OUT output via the output terminal 141 in FIG. 3(a) if the rising edge of the input signal IN is to be delayed using the circuit arrangement'shown in FIG. 3(a), and to simply invert the output signal OUT output via the output terminal 141 in FIG. 4(a) if the falling edge of the input signal IN is to be delayed using the circuit arrangement shown in FIG. 4(a).

Next, a description will be given of a first embodiment of the variable delay circuit according to the present invention, by referring to FIGS. 5 through 8.

Figure 5:
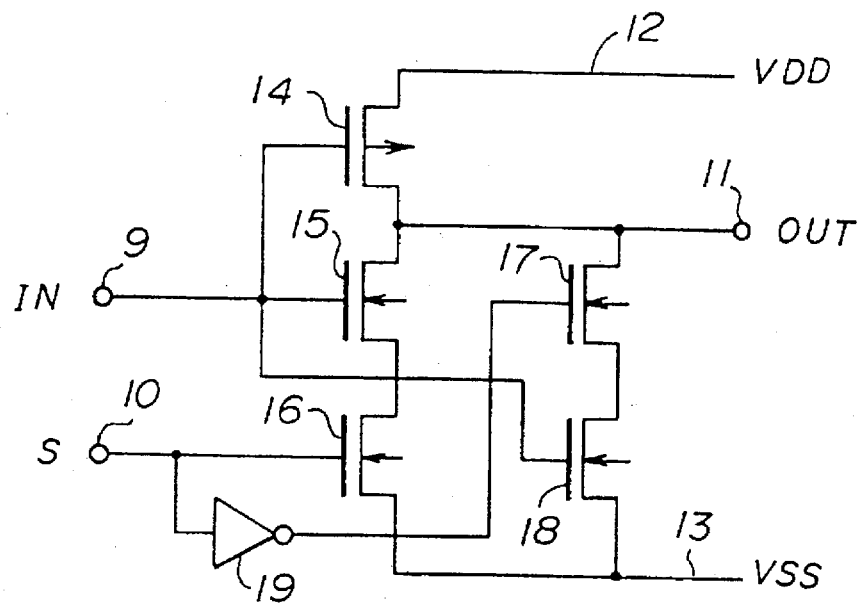
FIG. 5 is a circuit diagram showing a first embodiment of a variable delay circuit according to the present invention.

FIG. 5 shows the first embodiment. An input signal IN is input to an input terminal 9, a selection signal S is input to an input terminal 10, and an output signal OUT is output from an output terminal 11. A power source line 12 supplies a power source voltage $V_{DD}$, and a power source line 13 supplies a power source voltage $V_{SS}$, where $V_{SS} < V_{DD}$. The variable delay circuit includes a p-channel metal insulator semiconductor (MIS) or metal oxide semiconductor (MOS) transistor 14, n-channel MIS or MOS transistors 15 through 18, and an inverter 19 which are connected as shown. The transistor 14 forms a pull-up circuit, and the transistors 15 through 18 form a pull-down circuit.

In a series circuit which is made up of the transistors 15 and 16, a gate of the transistor 15 is connected to the input terminal 9. Transistor 15 is connected to the first stage counted from the output terminal 11. On the other hand, in a series circuit which is made up of the transistors 17 and 18, a gate of the transistor 18 is connected to the input terminal 9. Transistor 18 is connected to the second stage counted from the output terminal 11. In other words, between the series circuit made up of the transistors 15 and 16 and the series circuit made up of the transistors 17 and 18, the gate of only one of the transistors connected to the same stage counted from the output terminal 11 or the power source line 13 is connected to the input terminal 9.

On the other hand, in the series circuit which is made up of the transistors 15 and 16, a gate of the transistor 16 is connected to the input terminal 9 for receiving the selection signal S. In addition, in the series circuit which is made up of the transistors 17 and 18, a gate of the transistor 17 is connected to an output terminal of the inverter 19. In other words, one of the series circuit made up of the transistors 15 and 16 and the series circuit made up of the transistors 17 and 18 is selected and made active as a pull-down circuit in response to the selection signal S. This selection of the series circuits forms a characterizing feature of this embodiment, and is used as one means of obtaining two kinds of delay times as will be described later.

Figure 6:
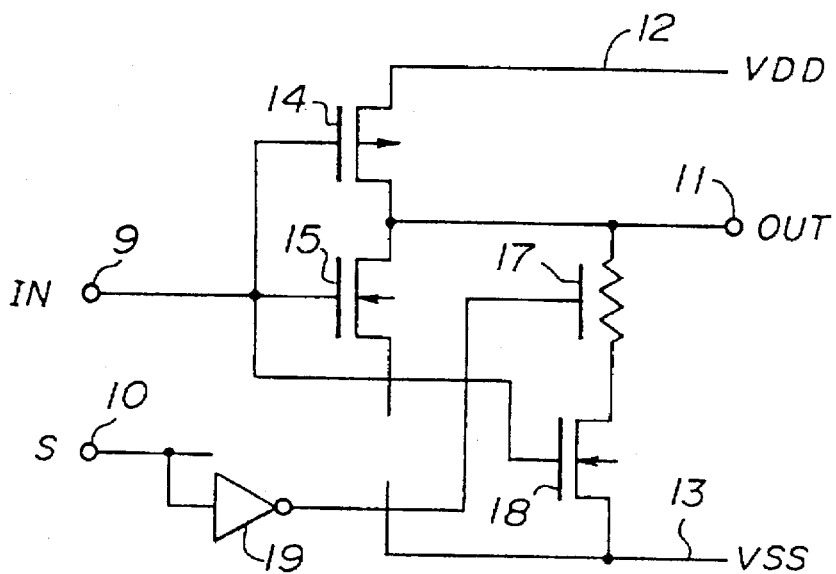
FIGS. 6 and 7 are circuit diagrams for explaining the operation of the first embodiment.
Figure 7:
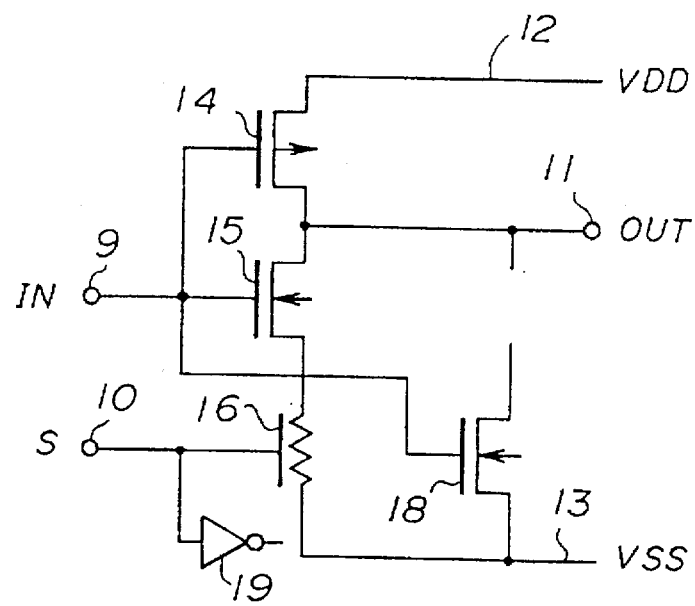
Figure 8:
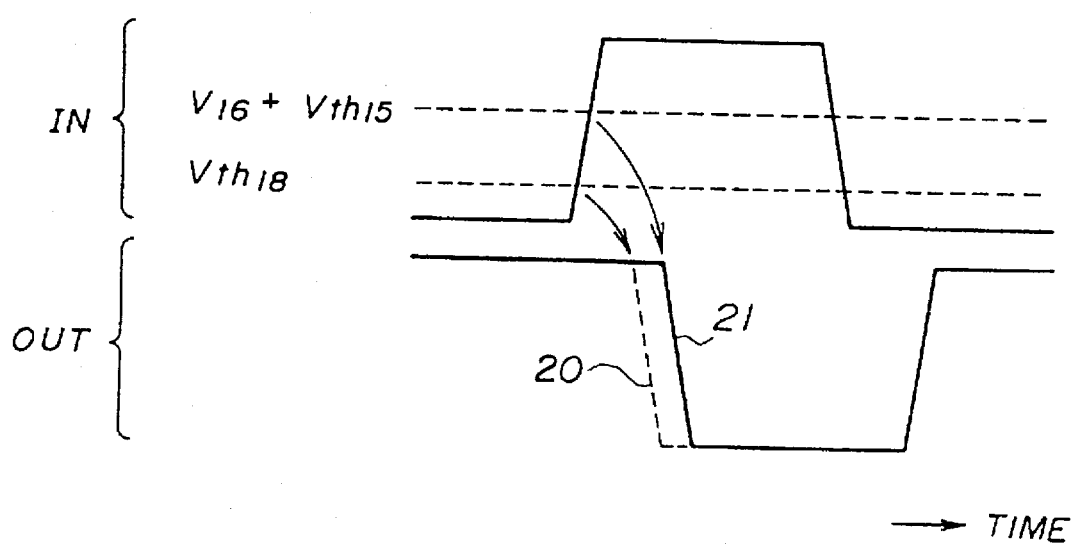
FIG. 8 is a time chart for explaining the operation of the first embodiment.

FIGS. 6 and 7 are circuit diagrams for explaining the operation of this embodiment, and FIG. 8 is a time chart for explaining the operation of this embodiment. In this embodiment, the transistor 16 becomes non-conductive (that is, OFF) and the transistor 17 becomes conductive (that is, ON) during a low level period of the selection signal S.

FIG. 6 shows an equivalent circuit of this embodiment during the low-level period of the selection signal S, and in FIG. 6, the transistor 17 is shown as an ON-resistance.

In this case, if the input signal IN has a low level, the transistor 14 is ON, the transistor 18 is OFF, and the output signal OUT has a high level. When the input signal IN undergoes a transition to a high level, the transistor 14 turns OFF, the transistor 18 turns ON, and the output signal OUT is inverted from the high level to a low level.

The transistor 18 turns ON at the time when the input signal IN rises to a threshold voltage $V_{th18}$ of the transistor 18. In FIG. 8, a dotted line 20 shows the transition of the output signal OUT in this case.

On the other hand, the transistor 16 is ON and the transistor 17 is OFF during a high-level period of the selection signal S.

FIG. 7 shows an equivalent circuit of this embodiment during the high-level period of the selection signal S, and in FIG. 7, the transistor 16 is shown as an ON-resistance.

In this case, if the input signal IN has the low level, the transistor 14 is ON, the transistor 15 is OFF and the output signal OUT has the high level. When the input signal IN undergoes a transition to the high level, the transistor 14 turns OFF, the transistor 15 turns ON, and the output signal OUT is inverted from the high level to the low level.

The transistor 15 turns ON at the time when the input signal IN rises to a voltage which is the sum of a voltage drop $V_{16}$ introduced by an ON-resistance of the transistor 16 and a threshold voltage $V_{th15}$ of the transistor 15. In FIG. 8, a solid line 21 shows the transition of the output signal OUT in this case.

According to this first embodiment, it is possible to easily obtain two kinds of delay times having a fine time difference with respect to the low-level output signal OUT by the selection made in response to the selection signal S. Hence, this embodiment may be easily applied to a circuit for finely adjusting the delay time and the like.

Next, a description will be given of a second embodiment of the variable delay circuit, by referring to FIGS. 9 through 12.

Figure 9:
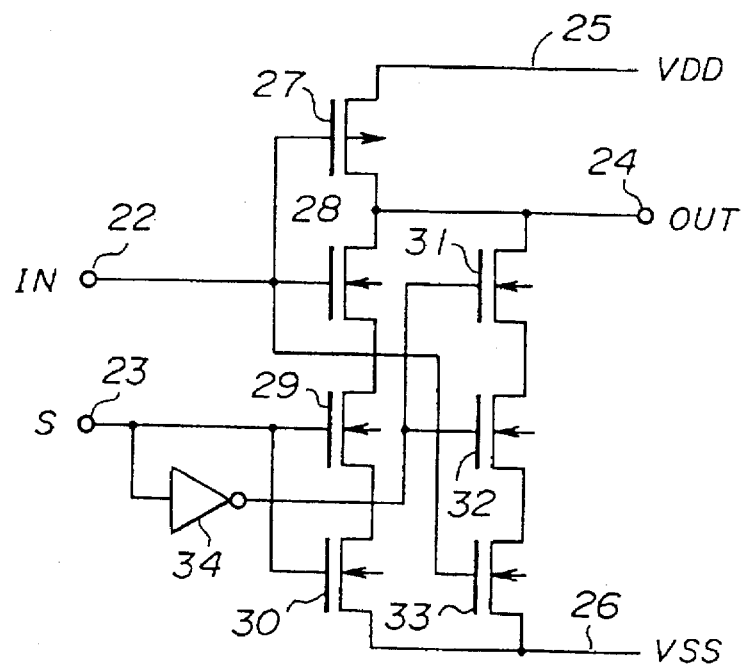
FIG. 9 is a circuit diagram showing a second embodiment of the variable delay circuit according to the present invention.

FIG. 9 shows the second embodiment. An input signal IN is input to an input terminal 22, a selection signal S is input to an input terminal 23, and an output signal OUT is output from an output terminal 24. A power source line 25 supplies a power source voltage $V_{DD}$, and a power source line 26 supplies a power source voltage $V_{SS}$, where $V_{SS}<V_{DD}$. The variable delay circuit includes a p-channel MIS or MOS transistor 27, n-channel MIS or MOS transistors 28 through 33, and an inverter 34 which are connected as shown. The transistor 27 forms a pull-up circuit, and the transistors 28 through 33 form a pull-down circuit.

In a series circuit which is made up of the transistors 28, 29 and 30, transistor 28 is connected to the first stage counted from the output terminal 24. A gate of the transistor 28 is connected to the input terminal 22. On the other hand, in a series circuit which is made up of the transistors 31, 32 and 33, transistor 32 is connected to the third stage counted from the output transistor 24. A gate of the transistor 32 is connected to the input terminal 22. In other words, between the series circuit made up of the transistors 28, 29 and 30 and the series circuit made up of the transistors 31, 32 and 33, the gate of only one of the transistors connected to the same stage counted from the output terminal 24 or the power source line 26 is connected to the input terminal 22.

On the other hand, in the series circuit which is made up of the transistors 28, 29 and 30, gates of the transistors 29 and 30 are connected to the input terminal 23 for receiving the selection signal S. In addition, in the series circuit which is made up of the transistors 31, 32 and 33, gates of the transistors 31 and 32 are connected to an output terminal of the inverter 34. In other words, one of the series circuit made up of the transistors 28, 29 and 30 and the series circuit made up of the transistors 31, 32 and 33 is selected and made active as a pull-down circuit in response to the selection signal S. This selection of the series circuits forms a characterizing feature of this embodiment, and is used as one means of obtaining two kinds of delay times as will be described later.

Figure 10:
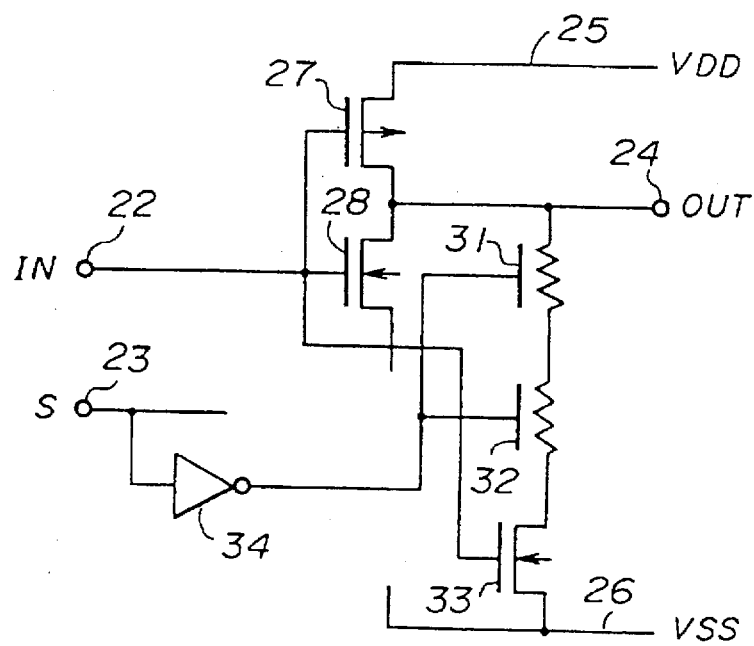
FIGS. 10 and 11 are circuit diagrams for explaining the operation of the second embodiment.
Figure 11:
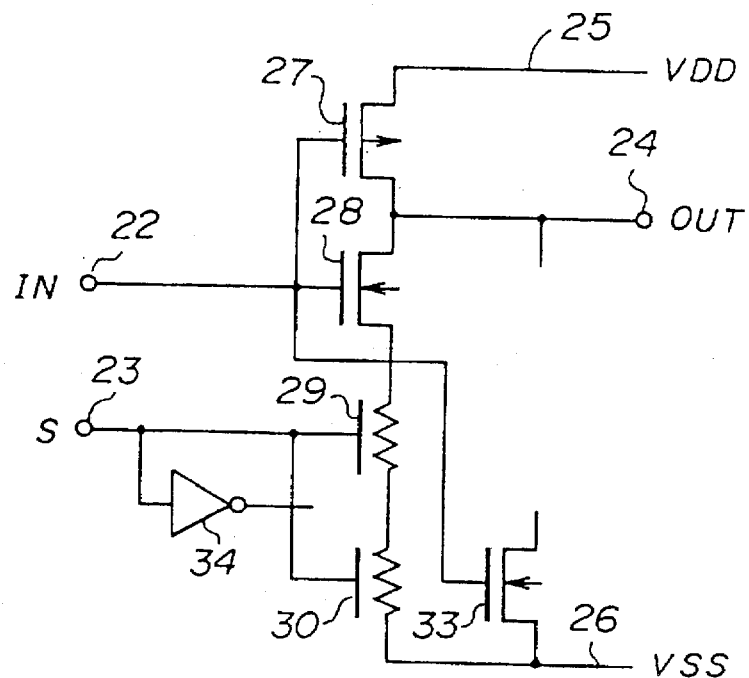
Figure 12:
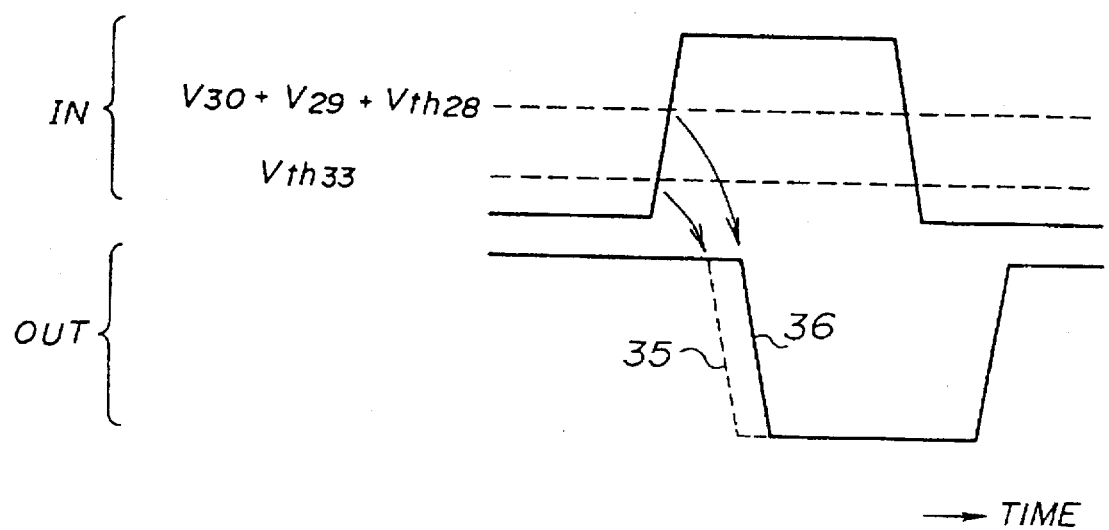
FIG. 12 is a time chart for explaining the operation of the second embodiment.

FIGS. 10 and 11 are circuit diagrams for explaining the operation of this embodiment, and FIG. 12 is a time chart for explaining the operation of this embodiment. In this embodiment, the transistors 29 and 30 become OFF and the transistors 31 and 32 become ON during a low-level period of the selection signal S.

FIG. 10 shows an equivalent circuit of this embodiment during the low-level period of the selection signal S, and in FIG. 10, the transistors 31 and 32 are shown as ON-resistances.

In this case, if the input signal IN has a low level, the transistor 27 is ON, the transistor 33 is OFF, and the output signal OUT has a high level. When the input signal IN undergoes a transition to a high level, the transistor 27 turns OFF, the transistor 33 turns ON, and the output signal OUT is inverted from the high level to a low level.

The transistor 33 turns ON at the time when the input signal IN rises to a threshold voltage $V_{th33}$ of the transistor 33. In FIG. 12, a dotted line 35 shows the transition of the output signal OUT in this case.

On the other hand, the transistors 29 and 30 are ON and the transistors 31 and 32 are OFF during a high-level period of the selection signal S.

FIG. 11 shows an equivalent circuit of this embodiment during the high-level period of the selection signal S, and in FIG. 11, the transistors 29 and 30 are shown as ON-resistances.

In this case, if the input signal IN has the low level, the transistor 27 is ON, the transistor 28 is OFF and the output signal OUT has the high level. When the input signal IN undergoes a transition to the high level, the transistor 27 turns OFF, the transistor 28 turns ON, and the output signal OUT is inverted from the high level to the low level.

The transistor 28 turns ON at the time when the input signal IN rises to a voltage which is the sum of a voltage drop $V_{30}$ introduced by an ON-resistance of the transistor 30, a voltage drop $V_{29}$ introduced by an ON-resistance of the transistor 19 and a threshold voltage $V_{th28}$ of the transistor 28. In FIG. 12, a solid line 36 shows the transition of the output signal OUT in this case.

According to this second embodiment, it is possible to easily obtain two kinds of delay times larger than those of the first embodiment and having a fine time difference with respect to the low-level output signal OUT by the selection made in response to the selection signal S. Hence, this embodiment may be easily applied to a circuit for finely adjusting the delay time and the like.

Next, a description will be given of a third embodiment of the variable delay circuit according to the present invention, by referring to FIGS. 13 through 17.

Figure 13:
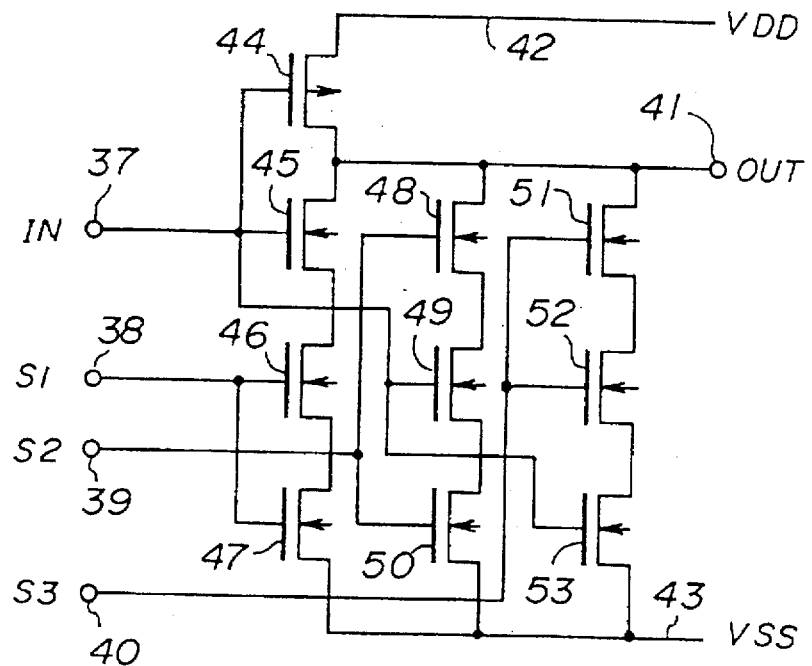
FIG. 13 is a circuit diagram showing a third embodiment of the variable delay circuit according to the present invention.

FIG. 13 shows the third embodiment. An input signal IN is input to an input terminal 37, selection signals S1, S2 and S3 are respectively input to input terminals 38, 39 and 40, and an output Signal OUT is output from an output terminal 41. A power source line 42 supplies a power source voltage $V_{DD}$, and a power source line 43 supplies a power source voltage $V_{SS}$, where $V_{SS} < V_{DD}$. The variable delay circuit includes a p-channel MIS or MOS transistor 44, and n-channel MIS or MOS transistors 45 through 53 which are connected as shown. The transistor 44 forms a pull-up circuit, and the transistors 45 through 53 form a pull-down circuit.

In a series circuit which is made up of the transistors 45, 46 and 47, transistor 45 is connected to the first stage counted from the output terminal 41. A gate of the transistor 45 is connected to the input terminal 37. On the other hand, in a series circuit which is made up of the transistors 48, 49 and 50, transistor 49 is connected to the second stage counted from the output terminal 41. A gate of the transistor 49 is connected to the input terminal 37. In a series circuit which is made up of the transistors 51, 52 and 53, transistor 53 is connected to the third stage counted from the output terminal 41. A gate of the transistor 53 is connected to the input terminal 37. In other words, among the series circuit made up of the transistors 45, 46 and 47, the series circuit made up of the transistors 48, 49 and 50, and the series circuit made up of the transistors 51, 52 and 53, the gate of only one of the transistors connected to the same stage counted from the output terminal 41 or the power source line 43 is connected to the input terminal 37.

On the other hand, in the series circuit which is made up of the transistors 45, 46 and 47, gates of the transistors 46 and 47 are connected to the input terminal 38 for receiving the selection signal S1. In addition, in the series circuit which is made up of the transistors 48, 49 and 50, gates of the transistors 48 and 50 are connected to the input terminal 39 for receiving the selection signal S2. Furthermore, in the series circuit which is made up of the transistors 51, 52 and 53, gates of the transistors 51 and 52 are connected to the input terminal 40 for receiving the selection signal S3.

In other words, one of the series circuit made up of the transistors 45, 46 and 47, the series circuit made up of the transistors 48, 49 and 50, and the series circuit made up of the transistors 51, 52 and 53 is selected and made active as a pull-down circuit in response to the selection signals S1, S2 and S3. This selection of the series circuits forms a characterizing feature of this embodiment, and is used as one means of obtaining three kinds of delay times as will be described later.

Figure 14:
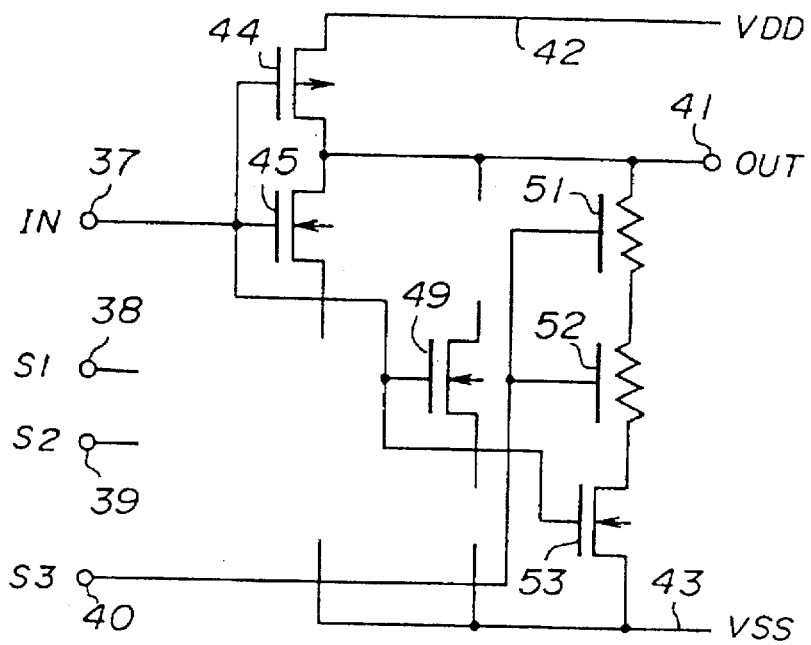
FIGS. 14, 15 and 16 are circuit diagrams for explaining the operation of the third embodiment.
Figure 15:
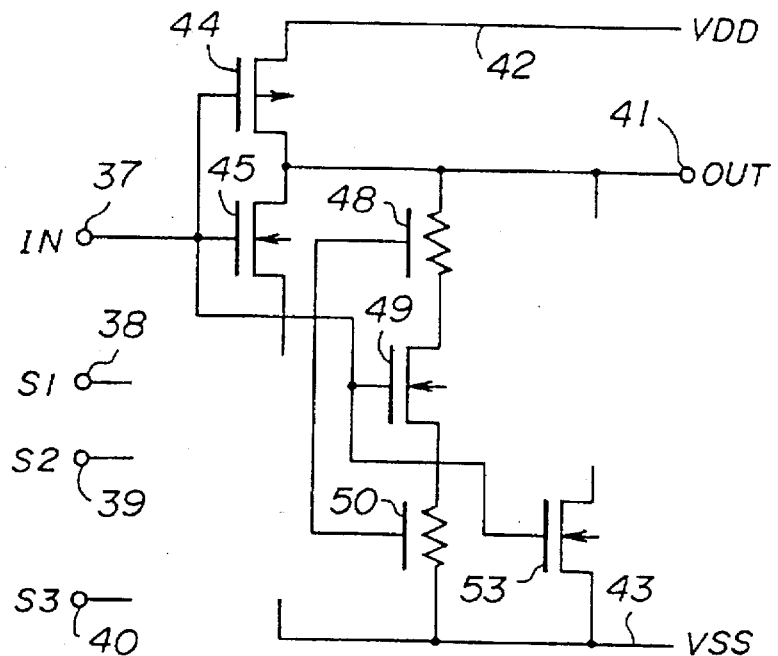
Figure 16:
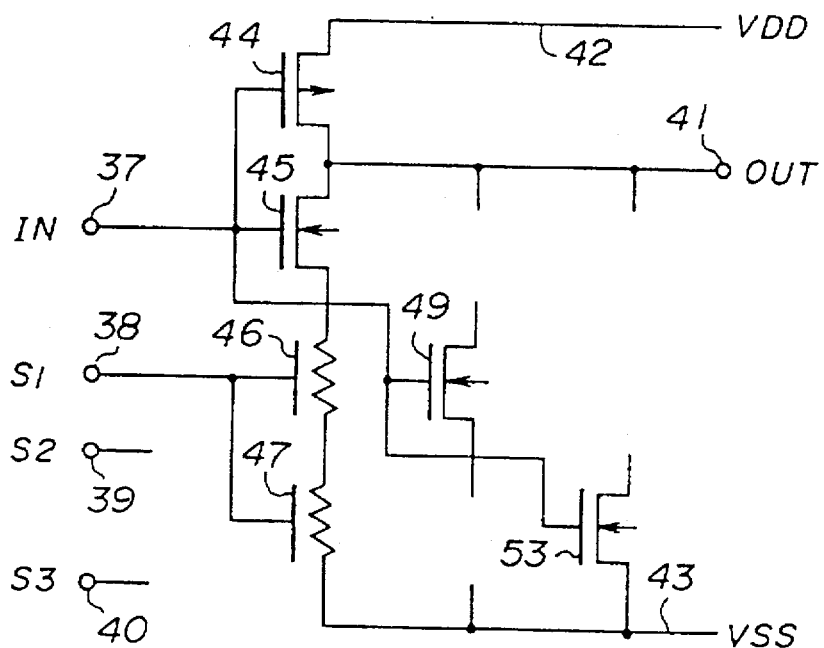
Figure 17:
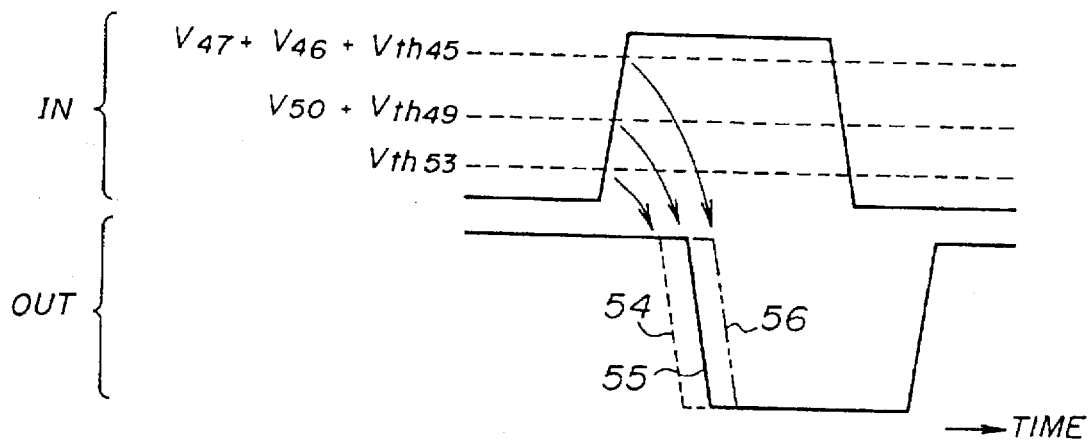
FIG. 17 is a time chart for explaining the operation of the third embodiment.

FIGS. 14, 15 and 16 are circuit diagrams for explaining the operation of this embodiment, and FIG. 17 is a time chart for explaining the operation of this embodiment. In this embodiment, the transistors 46, 47, 48 and 50 become OFF and the transistors 51 and 52 become ON if the selection signals S1 and S2 both have a low level and the selection signal S3 has a high level.

FIG. 14 shows an equivalent circuit of this embodiment for the case where the selection signals S1 and S2 both have the low level and the selection signal S3 has the high level, and in FIG. 14, the transistors 51 and 52 are shown as ON-resistances.

In this case, if the input signal IN has a low level, the transistor 44 is ON, the transistor 53 is OFF, and the output signal OUT has a high level. When the input signal IN undergoes a transition to a high level, the transistor 44 turns OFF, the transistor 53 turns ON, and the output signal OUT is inverted from the high level to a low level.

The transistor 53 turns ON at the time when the input signal IN rises to a threshold voltage Vth53 of the transistor 53. In FIG. 17, a dotted line 54 shows the transition of the output signal OUT in this case.

On the other hand, the transistors 46, 47, 51 and 52 are OFF and the transistors 48 and 50 are ON when the selection signals S1 and S3 have the low level and the selection signal S2 has the high level.

FIG. 15 shows an equivalent circuit of this embodiment for the case where the selection signals S1 and S3 have the low level and the selection signal S2 has the high level, and in FIG. 15, the transistors 48 and 50 are shown as ON-resistances.

In this case, if the input signal IN has the low level, the transistor 44 is ON, the transistor 49 is OFF and the output signal OUT has the high level. When the input signal IN undergoes a transition to the high level, the transistor 44 turns OFF, the transistor 49 turns ON, and the output signal OUT is inverted from the high level to the low level.

The transistor 49 turns ON at the time when the input signal IN rises to a voltage which is the sum of a voltage drop $V_{50}$ introduced by an ON-resistance of the transistor 50 and a threshold voltage $V_{th49}$ of the transistor 49. In FIG. 17, a solid line 55 shows the transition of the output signal OUT in this case.

Furthermore, the transistors 46 and 47 become ON and the transistors 48, 50, 51 and 52 become OFF if the selection signal S1 has the high level and the selection signals S2 and S3 both have the low level. FIG. 16 shows an equivalent circuit of this embodiment for the case where the selection signal S1 has the high level and the selection signals S2 and S3 have the low level, and in FIG. 16, the transistors 46 and 47 are shown as ON-resistances.

In this case, if the input signal IN has the low level, the transistor 44 is ON, the transistor 45 is OFF and the output signal OUT has the high level. When the input signal IN undergoes a transition to the high level, the transistor 44 turns OFF, the transistor 45 turns ON, and the output signal OUT is inverted from the high level to the low level.

The transistor 45 turns ON at the time when the input signal IN rises to a voltage which is the sum of a voltage drop $V_{47}$ introduced by an ON-resistance of the transistor 47, a voltage drop $V_{46}$ introduced by an ON-resistance of the transistor 46 and a threshold voltage $V_{th45}$ of the transistor 45. In FIG. 17, a two dot chain line 56 shows the transition of the output signal OUT in this case.

According to this third embodiment, it is possible to easily obtain three kinds of delay times having a fine time difference with respect to the low-level output signal OUT by the selection made in response to the selection signals S1, S2 and S3. Hence, this embodiment may be easily applied to a circuit for finely adjusting the delay time and the like.

Next, a description will be given of a fourth embodiment of the variable delay circuit, by referring to FIGS. 18 through 21.

Figure 18:
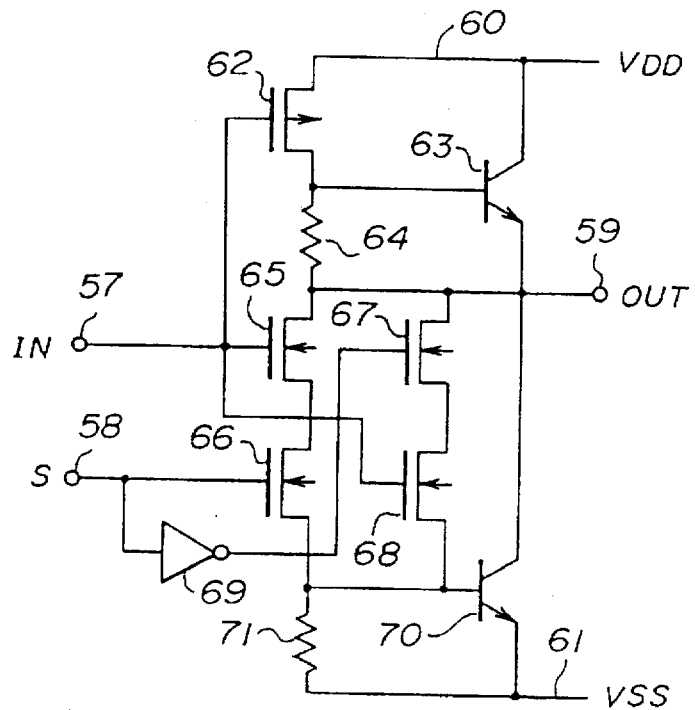
FIG. 18 is a circuit diagram showing a fourth embodiment of the variable delay circuit according to the present invention.

FIG. 18 shows the fourth embodiment. An input signal IN is input to an input terminal 57, a selection signal S is input to an input terminal 58, and an output signal OUT is output from an output terminal 59. A power source line 60 supplies a power source voltage $V_{DD}$, and a power source line 61 supplies a power source voltage $V_{SS}$, where $V_{SS} < V_{DD}$. The variable delay circuit includes a p-channel MIS or MOS transistor 62, an NPN transistor 63, a resistor 64 for drawing the base charge of the NPN transistor 63, n-channel MIS or MOS transistors 65 through 68, an inverter 69, an NPN transistor 70, and a resistor 71 for drawing the base charge of the NPN transistor 70 which are connected as shown. The transistors 62 and 63 and the resistor 64 form a pull-up circuit. The transistors 65 through 68, the inverter 69, the transistor 70 and the resistor 71 form a pull-down circuit.

In a series circuit which is made up of the transistors 65 and 66, transistor 65 is connected to the first stage counted from the output terminal 59. A gate of the transistor 65 is connected to the input terminal 57. On the other hand, in a series circuit which is made up of the transistors 67 and 68, transistor 68 is connected to the second stage counted from the output terminal 59. A gate of the transistor 68 is connected to the input terminal 57. In other words, between the series circuit made up of the transistors 65 and 66 and the series circuit made up of the transistors 67 and 68, the gate of only one of the transistors connected to the same stage counted from the output terminal 59 or the a base of the NPN transistor 70 is connected to the input terminal 57.

On the other hand, in the series circuit which is made up of the transistors 65 and 66, a gate of the transistor 66 is connected to the input terminal 58 for receiving the selection signal S. In addition, in the series circuit which is made up of the transistors 67 and 68, a gate of the transistor 67 is connected to an output terminal of the inverter 69. In other words, one of the series circuit made up of the transistors 65 and 66 and the series circuit made up of the transistors 67 and 68 is selected and made active in response to the selection signal S, so as to select the pull-down circuit formed by the transistors 65, 66 and 70 and the resistor 71 or the pull-down circuit formed by the transistors 67, 68 and 70 and the resistor 71. This selection of the series circuits or, the pull-down circuits, forms a characterizing feature of this embodiment, and is used as one means of obtaining two kinds of delay times as will be described later.

Figure 19:
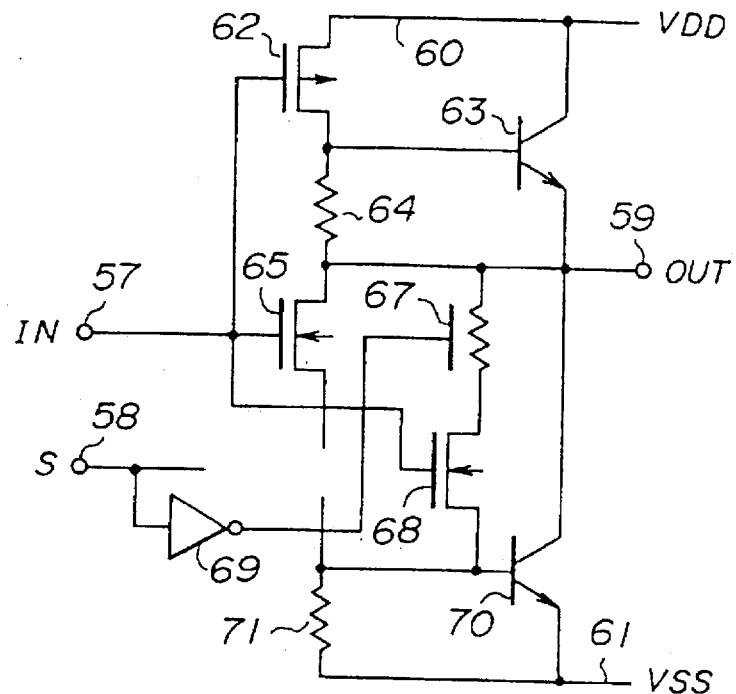
FIGS. 19 and 20 are circuit diagrams for explaining the operation of the fourth embodiment.
Figure 20:
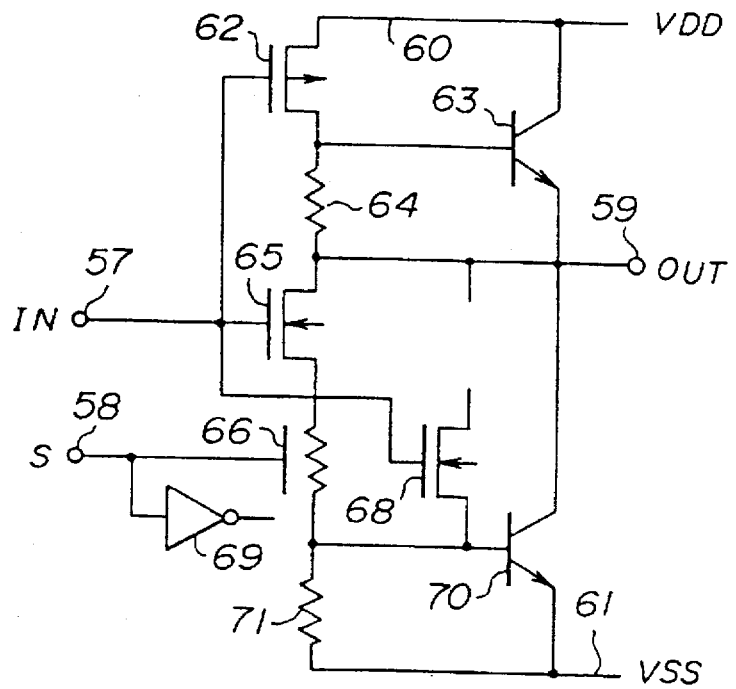
Figure 21:
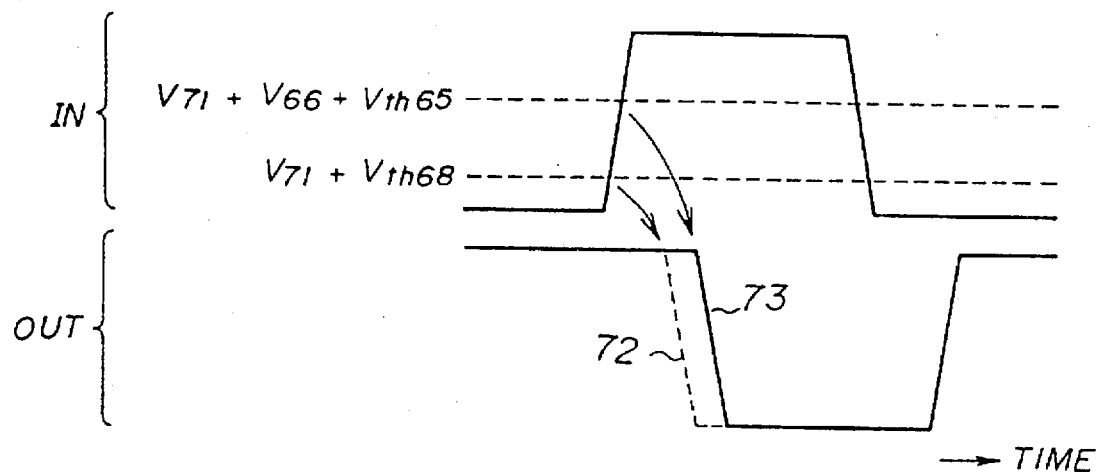
FIG. 21 is a time chart for explaining the operation of the fourth embodiment.

FIGS. 19 and 20 are circuit diagrams for explaining the operation of this embodiment, and FIG. 21 is a time chart for explaining the operation of this embodiment. In this embodiment, the transistor 66 becomes OFF and the transistor 67 becomes ON during a low-level period of the selection signal S.

FIG. 19 shows an equivalent circuit of this embodiment during the low-level period of the selection signal S, and in FIG. 19, the transistor 67 is shown as an ON-resistance.

In this case, if the input signal IN has a low level, the transistor 62 is ON, the NPN transistor 63 is ON, the transistor 68 is OFF, the NPN transistor 70 is OFF, and the output signal OUT has a high level. When the input signal IN undergoes a transition to a high level, the transistor 62 turns OFF, the NPN transistor 63 turns OFF, the transistor 68 turns ON, the NPN transistor 70 turns ON, and the output signal OUT is inverted from the high level to a low level.

The transistor 68 turns ON at the time when the input signal IN rises to a voltage which is the sum of a voltage drop $V_{71}$ introduced by the resistor 71 and a threshold voltage $V_{th68}$ of the transistor 68. In FIG. 21, a dotted line 72 shows the transition of the output signal OUT in this case.

On the other hand, the transistor 66 is ON and the transistor 67 is OFF during a high-level period of the selection signal S.

FIG. 20 shows an equivalent circuit of this embodiment during the high-level period of the selection signal S, and in FIG. 20, the transistor 66 is shown as an ON-resistance.

In this case, if the input signal IN has the low level, the transistor 62 is ON, the NPN transistor 63 is ON, the transistor 65 is OFF, the NPN transistor 70 is OFF and the output signal OUT has the high level. When the input signal IN undergoes a transition to the high level, the transistor 62 turns OFF, the NPN transistor 63 turns OFF, the transistor 65 turns ON, the NPN transistor 70 turns ON and the output signal OUT is inverted from the high level to the low level.

The transistor 65 turns ON at the time when the input signal IN rises to a voltage which is the sum of a voltage drop $V_{71}$ introduced by the resistor 71, a voltage drop $V_{66}$ introduced by an ON-resistance of the transistor 66 and a threshold voltage $V_{th65}$ of the transistor 65. In FIG. 21, a solid line 73 shows the transition of the output signal OUT in this case.

According to this fourth embodiment, it is possible to easily obtain two kinds of delay times having a fine time difference with respect to the low-level output signal OUT by the selection made in response to the selection signal S using a BiCMOS structure. Hence, this embodiment may be easily applied to a circuit for finely adjusting the delay time and the like.

Next, a description will be given of a fifth embodiment of the variable delay circuit according to the present invention, by referring to FIGS. 22 through 25.

Figure 22:
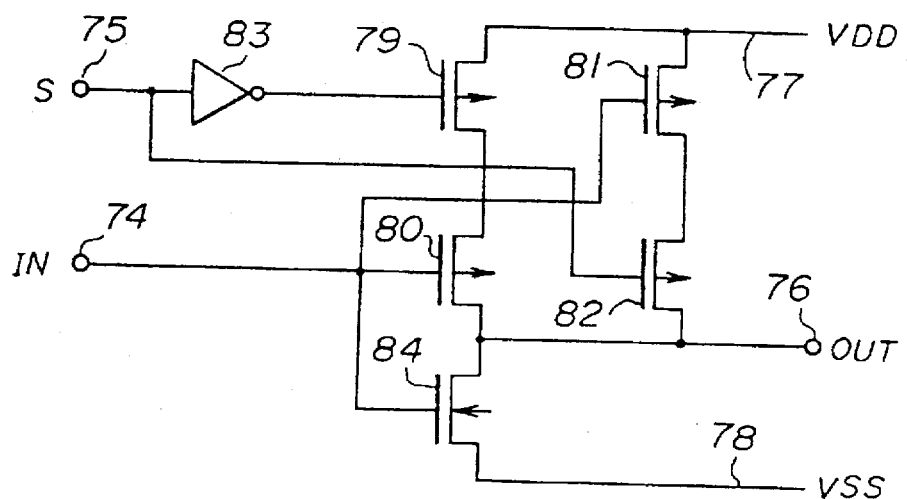
FIG. 22 is a circuit diagram showing a fifth embodiment of the variable delay circuit according to the present invention.

FIG. 22 shows the fifth embodiment. An input signal IN is input to an input terminal 74, a selection signal S is input to an input terminal 75, and an output signal OUT is output from an output terminal 76. A power source line 77 supplies a power source voltage $V_{DD}$, and a power source line 78 supplies a power source voltage $V_{SS}$, where $V_{SS} < V_{DD}$. The variable delay circuit includes a p-channel MIS or MOS transistors 79 through 82, an inverter 83, and an n-channel MIS or MOS transistor 84 which are connected as shown. The transistors 79 through 82 form a pull-up circuit, and the transistor 84 forms a pull-down circuit.

In a series circuit which is made up of the transistors 79 and 80, transistor 80 is connected to the second stage counted from the power source line 77. A gate of the transistor 80 is connected to the input terminal 74. On the other hand, in a series circuit which is made up of the transistors 81 and 82, transistor 81 is connected to the first stage counted from the power source line 77. A gate of the transistor 81 is connected to the input terminal 74. In other words, between the series circuit made up of the transistors 79 and 80 and the series circuit made up of the transistors 81 and 82, the gate of only one of the transistors connected to the same stage counted from the power source line 77 or the output terminal 76 is connected to the input terminal 74.

On the other hand, in the series circuit which is made up of the transistors 79 and 80, a gate of the transistor 79 is connected to an output terminal of the inverter 83. In addition, in the series circuit which is made up of the transistors 81 and 82, a gate of the transistor 82 is connected to the input terminal 75 for receiving the selection signal S. In other words, one of the series circuit made up of the transistors 79 and 80 and the series circuit made up of the transistors 81 and 82 is selected and made active as a pull-up circuit in response to the selection signal S. This selection of the series circuits forms a characterizing feature of this embodiment, and is used as one means of obtaining two kinds of delay times as will be described later.

Figure 23:
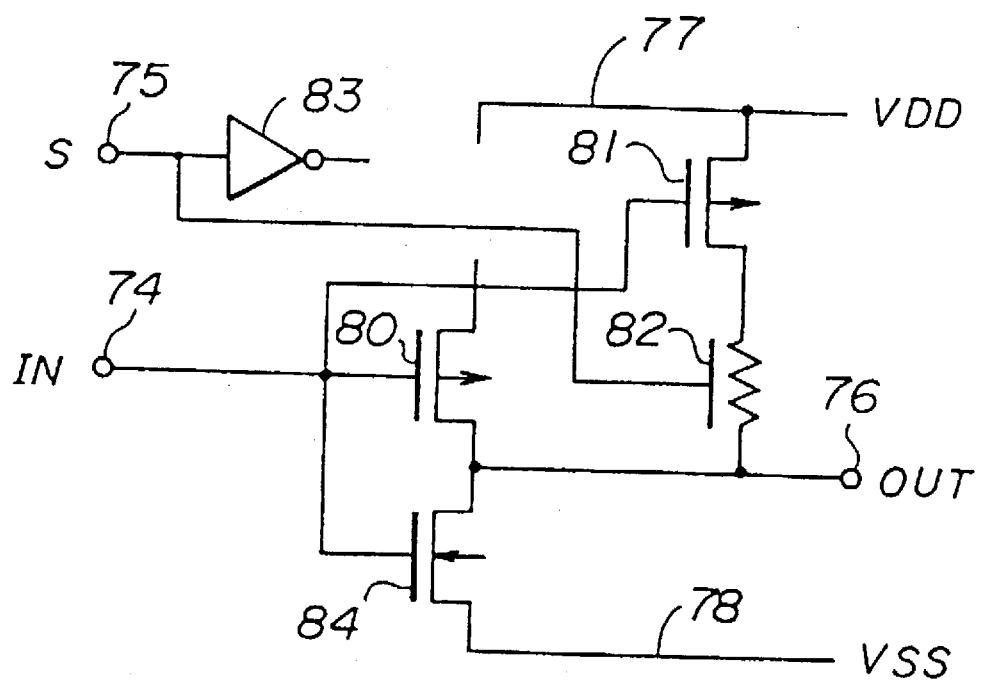
FIGS. 23 and 24 are circuit diagrams for explaining the operation of the fifth embodiment.
Figure 24:
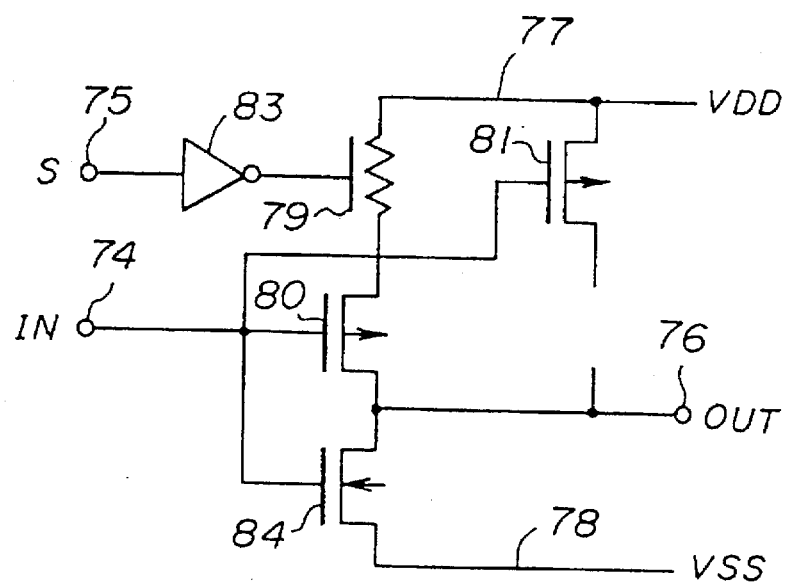
Figure 25:
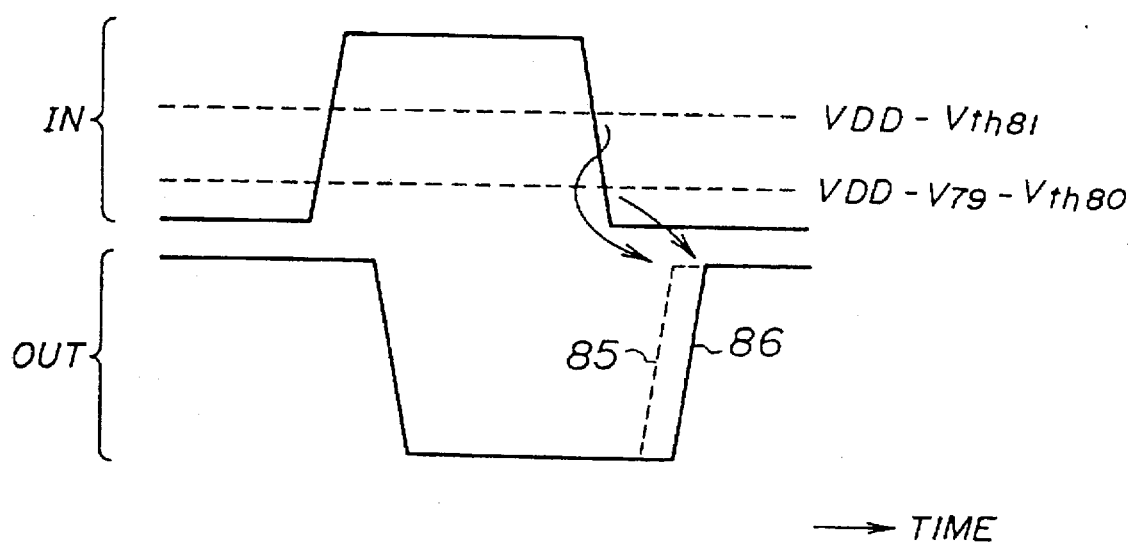
FIG. 25 is a time chart for explaining the operation of the fifth embodiment.

FIGS. 23 and 24 are circuit diagrams for explaining the operation of this embodiment, and FIG. 25 is a time chart for explaining the operation of this embodiment. In this embodiment, the transistor 79 becomes OFF and the transistor 82 becomes ON during a low-level period of the selection signal S.

FIG. 23 shows an equivalent circuit of this embodiment during the low-level period of the selection signal S, and in FIG. 23, the transistor 82 is shown as an ON-resistance.

In this case, if the input signal IN has a high level, the transistor 81 is OFF, the transistor 84 is ON, and the output signal OUT has a low level. When the input signal IN undergoes a transition to a low level, the transistor 81 turns ON, the transistor 84 turns OFF, and the output signal OUT is inverted from the low level to a high level.

The transistor 81 turns ON at the time when the input signal IN falls to a voltage $V_{DD}-V_{th81}$, where $V_{th81}$ denotes a threshold voltage of the transistor 81. In FIG. 25, a dotted line 85 shows the transition of the output signal OUT in this case.

On the other hand, the transistor 79 is ON and the transistor 82 is OFF during a high-level period of the selection signal S.

FIG. 24 shows an equivalent circuit of this embodiment during the high-level period of the selection signal S, and in FIG. 24, the transistor 79 is shown as an ON-resistance.

In this case, if the input signal IN has the high level, the transistor 80 is OFF, the transistor 84 is ON and the output signal OUT has the low level. When the input signal IN undergoes a transition to the low level, the transistor 80 turns ON, the transistor 84 turns OFF, and the output signal OUT is inverted from the low level to the high level.

The transistor 80 turns ON at the time when the input signal IN falls to a voltage $V_{DD}-V_{79}-V_{th80}$, where $V_{79}$ denotes a voltage drop introduced by an ON-resistance of the transistor 79 and $V_{th80}$ denotes a threshold voltage of the transistor 80. In FIG. 25, a solid line 86 shows the transition of the output signal OUT in this case.

According to this fifth embodiment, it is possible to easily obtain two kinds of delay times having a fine time difference with respect to the high-level output signal OUT by the selection made in response to the selection signal S. Hence, this embodiment may be easily applied to a circuit for finely adjusting the delay time and the like.

Next, a description will be given of a sixth embodiment of the variable delay circuit, by referring to FIGS. 26 through 29.

Figure 26:
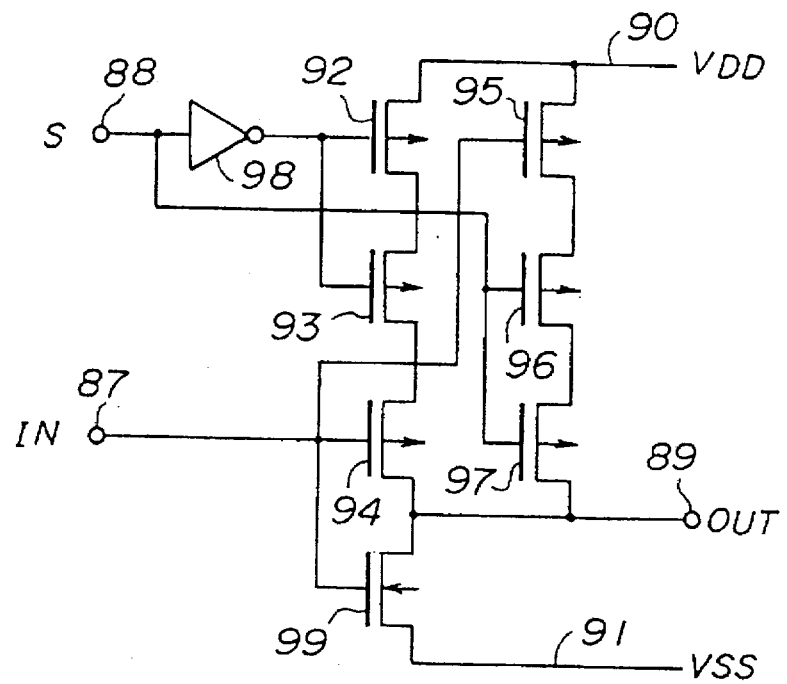
FIG. 26 is a circuit diagram showing a sixth embodiment of the variable delay circuit according to the present invention.

FIG. 26 shows the sixth embodiment. An input signal IN is input to an input terminal 87, a selection signal S is input to an input terminal 88, and an output signal OUT is output from an output terminal 89. A power source line 90 supplies a power source voltage $V_{DD}$, and a power source line 91 supplies a power source voltage $V_{SS}$, where $V_{SS}<V_{DD}$. The variable delay circuit includes p-channel MIS or MOS transistors 92 through 97, an inverter 98, and an n-channel MIS or MOS transistor 99 which are connected as shown. The transistors 92 through 97 form a pull-up circuit, and the transistor 99 forms a pull-down circuit.

In a series circuit which is made up of the transistors 92, 93 and 94, transistor 94 is connected to the third stage counted from the power source line 90. A gate of the transistor 94 is connected to the input terminal 87. On the other hand, in a series circuit which is made up of the transistors 95, 96 and 97, transistor 95 is connected to the first stage counted from the power source line 90. A gate of the transistor 95 is connected to the input terminal 87. In other words, between the series circuit made up of the transistors 92, 93 and 94 and the series circuit made up of the transistors 95, 96 and 97, the gate of only one of the transistors connected to the same stage counted from the power source line 90 or the output terminal 89 is connected to the input terminal 87.

On the other hand, in the series circuit which is made up of the transistors 92, 93 and 94, gates of the transistors 92 and 93 are connected to an output terminal of the inverter 98. In addition, in the series circuit which is made up of the transistors 95, 96 and 97, gates of the transistors 96 and 97 are connected to the input terminal 88 for receiving the selection signal S. In other words, one of the series circuit made up of the transistors 92, 93 and 94 and the series circuit made up of the transistors 95, 96 and 97 is selected and made active as a pull-up circuit in response to the selection signal S. This selection of the series circuits forms a characterizing feature of this embodiment, and is used as one means of obtaining two kinds of delay times as will be described later.

Figure 27:
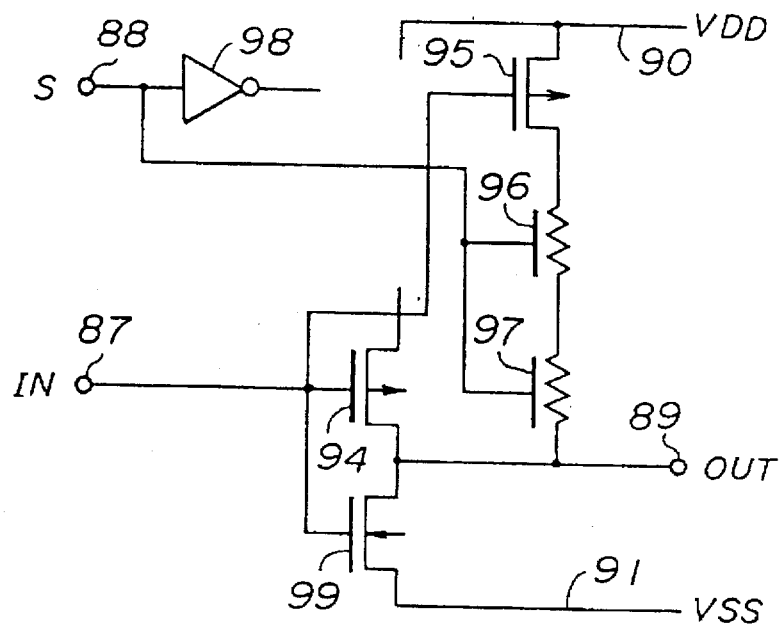
FIGS. 27 and 28 are circuit diagrams for explaining the operation of the sixth embodiment.
Figure 28:
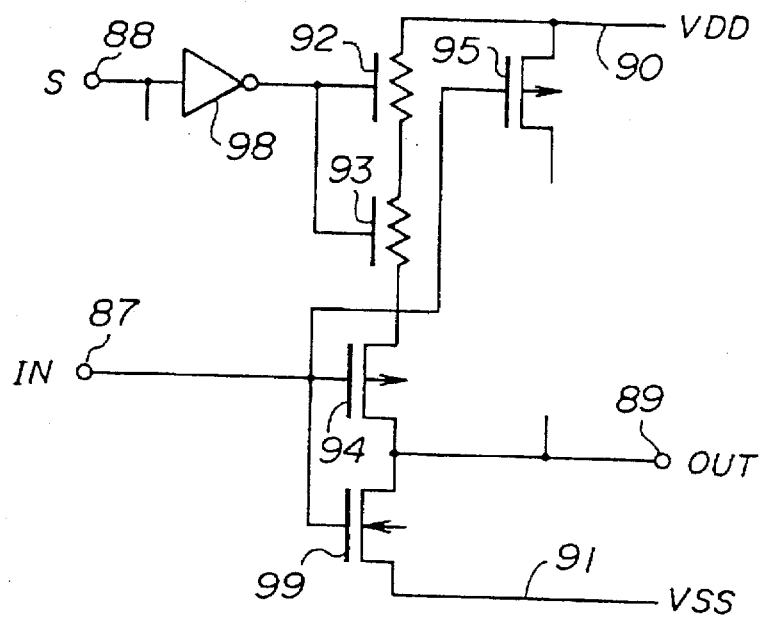
Figure 29:
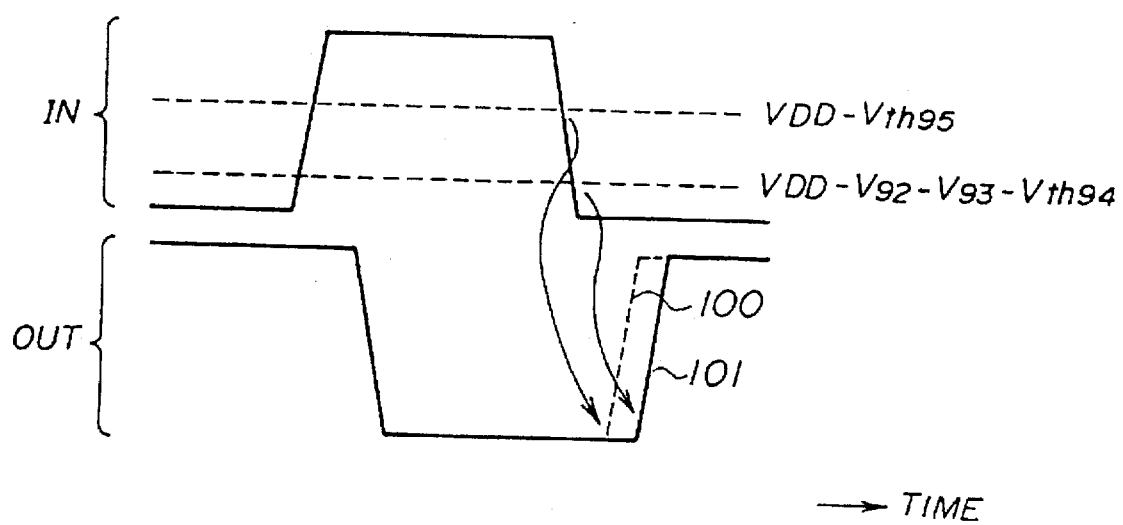
FIG. 29 is a time chart for explaining the operation of the sixth embodiment.

FIGS. 27 and 28 are circuit diagrams for explaining the operation of this embodiment, and FIG. 29 is a time chart for explaining the operation of this embodiment. In this embodiment, the transistors 92 and 93 become OFF and the transistors 96 and 97 become ON during a low-level period of the selection signal S.

FIG. 27 shows an equivalent circuit of this embodiment during the low-level period of the selection signal S, and in FIG. 27, the transistors 96 and 97 are shown as ON-resistances.

In this case, if the input signal IN has a high level, the transistor 95 is OFF, the transistor 99 is ON, and the output signal OUT has a low level. When the input signal IN undergoes a transition to a low level, the transistor 95 turns ON, the transistor 99 turns OFF, and the output signal OUT is inverted from the low level to a high level.

The transistor 95 turns ON at the time when the input signal IN falls to a voltage $V_{DD}-V_{th95}$, where $V_{th95}$ denotes a threshold voltage of the transistor 95. In FIG. 29, a dotted line 100 shows the transition of the output signal OUT in this case.

On the other hand, the transistors 92 and 93 are ON and the transistors 96 and 97 are OFF during a high-level period of the selection signal S.

FIG. 28 shows an equivalent circuit of this embodiment during the high-level period of the selection signal S, and in FIG. 28, the transistors 92 and 93 are shown as ON-resistances.

In this case, if the input signal IN has the high level, the transistor 94 is OFF, the transistor 99 is ON and the output signal OUT has the low level. When the input signal IN undergoes a transition to the low level, the transistor 94 turns ON, the transistor 99 turns OFF, and the output signal OUT is inverted from the low level to the high level.

The transistor 94 turns ON at the time when the input signal IN falls to a voltage $V_{DD}-V_{92}-V_{93}-V_{th94}$, where $V_{92}$ denotes a voltage drop introduced by the ON resistance of the transistor 92, $V_{93}$ denotes a voltage drop introduced by the ON-resistance of the transistor 93, and $V_{th94}$ denotes a threshold voltage of the transistor 94. In FIG. 29, a solid line 101 shows the transition of the output signal OUT in this case.

According to this sixth embodiment, it is possible to easily obtain two kinds of delay times larger than those of the fifth embodiment and having a fine time difference with respect to the high-level output signal OUT by the selection made in response to the selection signal S. Hence, this embodiment may be easily applied to a circuit for finely adjusting the delay time and the like.

Next, a description will be given of a seventh embodiment of the variable delay circuit according to the present invention, by referring to FIGS. 30 through 34.

Figure 30:
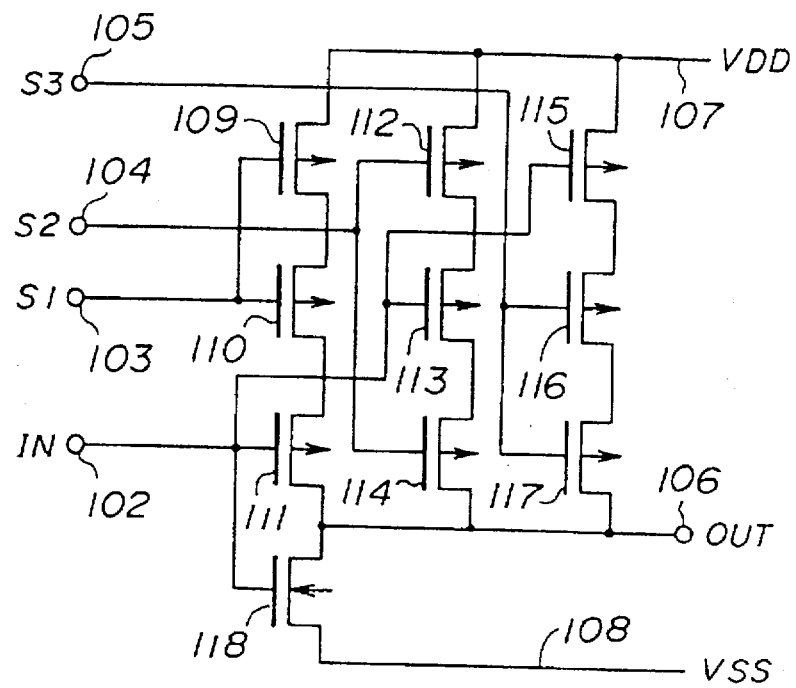
FIG. 30 is a circuit diagram showing a seventh embodiment of the variable delay circuit according to the present invention.

FIG. 30 shows the seventh embodiment. An input signal IN is input to an input terminal 102, selection signals S1, S2 and S3 are respectively input to input terminals 103, 104 and 105, and an output signal OUT is output from an output terminal 106. A power source line 107 supplies a power source voltage $V_{DD}$, and a power source line 108 supplies a power source voltage $V_{SS}$, where $V_{SS}<V_{DD}$. The variable delay circuit includes p-channel MIS or MOS transistors 109 through 117, and an n-channel MIS or MOS transistor 118 which are connected as shown. The transistors 109 through 117 form a pull-up circuit, and the transistor 118 forms a pull-down circuit.

In a series circuit which is made up of the transistors 109, 110 and 111, transistor 111 is connected to the third stage counted from the power source line 107. A gate of the transistor 111 is connected to the input terminal 102. On the other hand, in a series circuit which is made up of the transistors 112, 113 and 114, transistor 113 is connected to the second stage counted from the power source line 107. A gate of the transistor 113 is connected to the input terminal 102. In a series circuit which is made up of the transistors 115, 116 and 117, transistor 115 is connected to the first stage counted from the power source line 107. A gate of the transistor 115 is connected to the input terminal 102. In other words, among the series circuit made up of the transistors 109, 110 and 111, the series circuit made up of the transistors 112, 113 and 114, and the series circuit made up of the transistors 115, 116 and 117, the gate of only one of the transistors connected to the same stage counted from the power source line 107 or the output terminal 106 is connected to the input terminal 102.

On the other hand, in the series circuit which is made up of the transistors 109, 110 and 111, gates of the transistors 109 and 110 are connected to the input terminal 103 for receiving the selection signal S1. In addition, in the series circuit which is made up of the transistors 112, 113 and 114, gates of the transistors 112 and 114 are connected to the input terminal 104 for receiving the selection signal S2. Furthermore, in the series circuit which is made up of the transistors 115, 116 and 117, gates of the transistors 116 and 117 are connected to the input terminal 105 for receiving the selection signal S3.

In other words, one of the series circuit made up of the transistors 109, 110 and 111, the series circuit made up of the transistors 112, 113 and 114, and the series circuit made up of the transistors 115, 116 and 117 is selected and made active as a pull-up circuit in response to the selection signals S1, S2 and S3. This selection of the series circuits forms a characterizing feature of this embodiment, and is used as one means of obtaining three kinds of delay times as will be described later.

Figure 31:
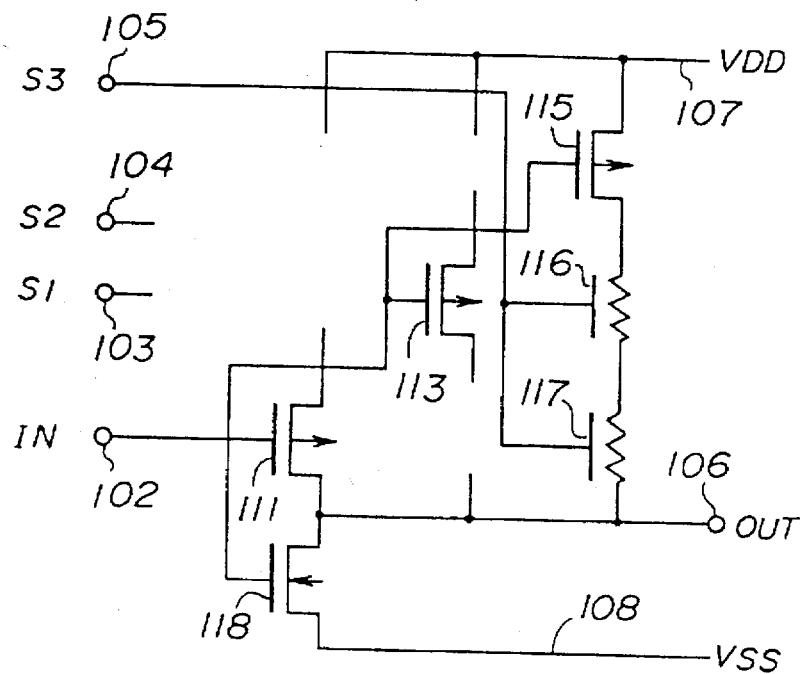
FIGS. 31, 32 and 33 are circuit diagrams for explaining the operation of the seventh embodiment.
Figure 32:
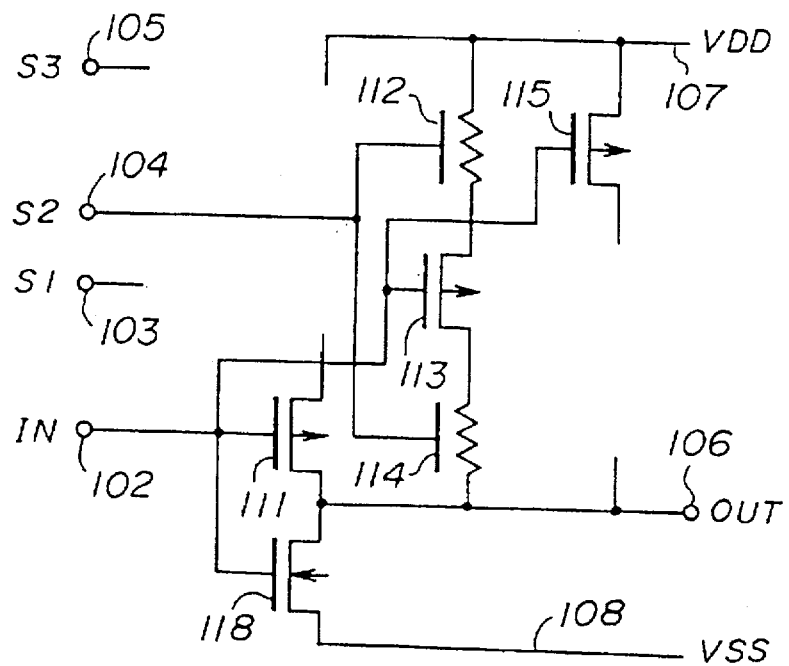
Figure 33:
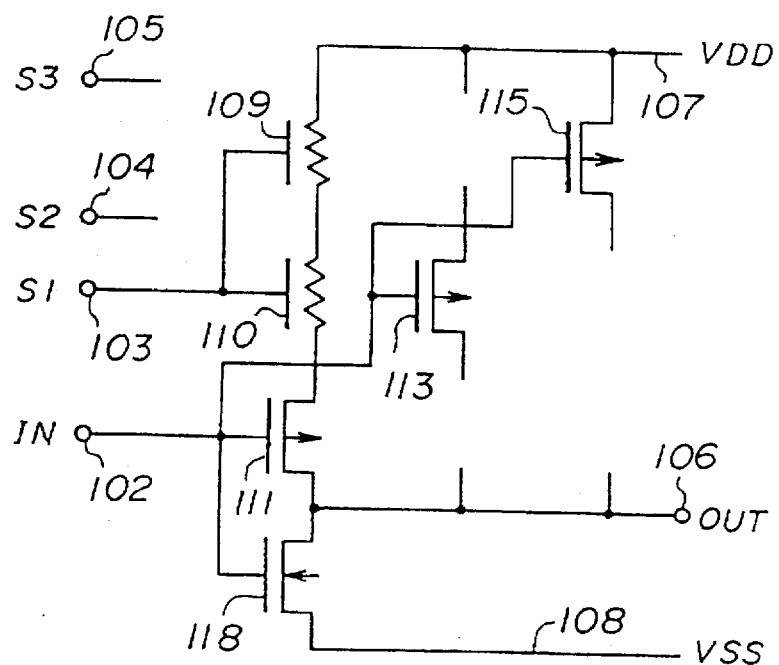
Figure 34:
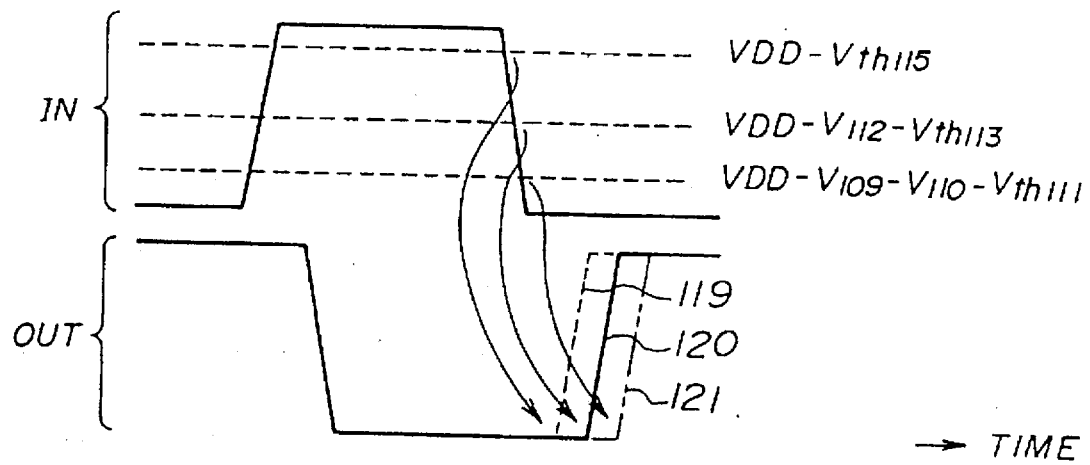
FIG. 34 is a time chart for explaining the operation of the seventh embodiment.

FIGS. 31, 32 and 33 are circuit diagrams for explaining the operation of this embodiment, and FIG. 34 is a time chart for explaining the operation of this embodiment. In this embodiment, the transistors 109, 110, 112 and 114 become OFF and the transistors 116 and 117 become ON if the selection signals S1 and S2 both have a high level and the selection signal S3 has a low level.

FIG. 31 shows an equivalent circuit of this embodiment for the case where the selection signals S1 and S2 both have the high level and the selection signal S3 has the low level, and in FIG. 31, the transistors 116 and 117 are shown as ON-resistances.

In this case, if the input signal IN has a high level, the transistor 115 is OFF, the transistor 118 is ON, and the output signal OUT has a low level. When the input signal IN undergoes a transition to a low level, the transistor 115 turns ON, the transistor 118 turns OFF, and the output signal OUT is inverted from the low level to a high level.

The transistor 115 turns ON at the time when the input signal IN falls to a voltage $V_{DD}-V_{th115}$, where $V_{th115}$ denotes a threshold voltage of the transistor 115. In FIG. 34, a dotted line 119 shows the transition of the output signal OUT in this case.

On the other hand, the transistors 109, 110, 116 and 117 are OFF and the transistors 112 and 114 are ON when the selection signals S1 and S3 have the high level and the selection signal S2 has the low level.

FIG. 32 shows an equivalent circuit of this embodiment for the case where the selection signals S1 and S3 have the high level and the selection signal S2 has the low level, and in FIG. 32, the transistors 112 and 114 are shown as ON-resistances.

In this case, if the input signal IN has the high level, the transistor 113 is OFF, the transistor 118 is ON and the output signal OUT has the low level. When the input signal IN undergoes a transition to the low level, the transistor 113 turns ON, the transistor 118 turns OFF, and the output signal OUT is inverted from the low level to the high level.

The transistor 113 turns ON at the time when the input signal IN falls to a voltage $V_{DD}-V_{112}-V_{th113}$, where $V_{112}$ denotes a voltage drop introduced by the ON-resistance of the transistor 112 and $V_{th113}$ denotes a threshold voltage of the transistor 113. In FIG. 34, a solid line 120 shows the transition of the output signal OUT in this case.

Furthermore, the transistors 109 and 110 become ON and the transistors 112, 114, 116 and 117 become OFF if the selection signal S1 has the low level and the selection signals S2 and S3 both have the high level. FIG. 33 shows an equivalent circuit of this embodiment for the case where the selection signal S1 has the low level and the selection signals S2 and S3 have the high level, and in FIG. 33, the transistors 109 and 110 are shown as ON-resistances.

In this case, if the input signal IN has the high level, the transistor 111 is OFF, the transistor 118 is ON and the output signal OUT has the low level. When the input signal IN undergoes a transition to the low level, the transistor 111 turns ON, the transistor 118 turns OFF, and the output signal OUT is inverted from the low level to the high level.

The transistor 111 turns ON at the time when the input signal IN falls to a voltage $V_{DD}-V_{109}-V_{110}-V_{th111}$, where $V_{109}$ denotes a voltage drop introduced by the ON-resistance of the transistor 109, $V_{110}$ denotes the voltage introduced by the ON-resistance of the transistor 110, and $V_{th111}$ denotes a threshold voltage of the transistor 111. In FIG. 34, a two dot chain line 121 shows the transition of the output signal OUT in this case.

According to this seventh embodiment, it is possible to easily obtain three kinds of delay times having a fine time difference with respect to the high-level output signal OUT by the selection made in response to the selection signals S1, S2 and S3. Hence, this embodiment may be easily applied to a circuit for finely adjusting the delay time and the like.

Next, a description will be given of an eighth embodiment of the variable delay circuit, by referring to FIGS. 35 through 38.

Figure 35:
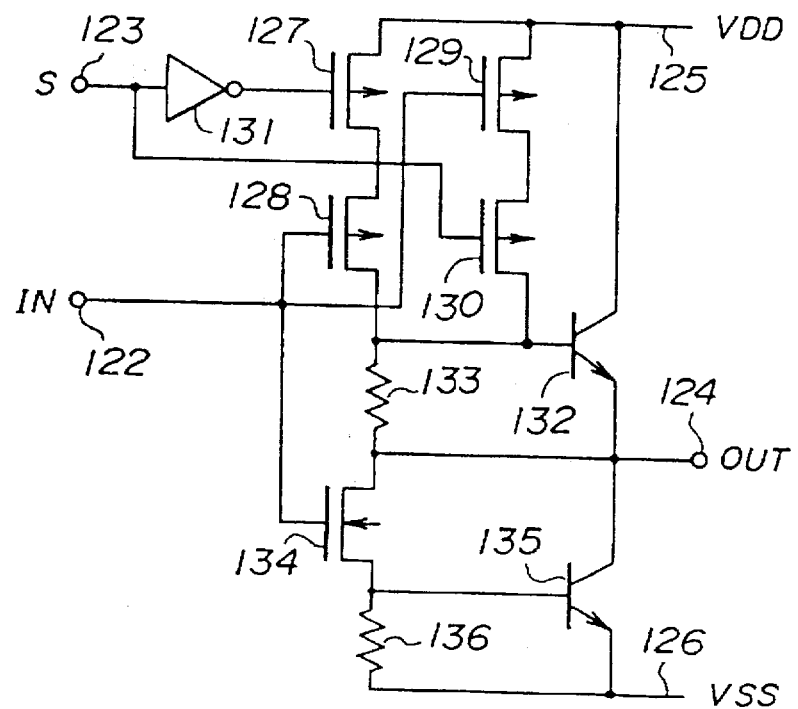
FIG. 35 is a circuit diagram showing an eighth embodiment of the variable delay circuit according to the present invention.

FIG. 35 shows the eighth embodiment. An input signal IN is input to an input terminal 122, a selection signal S is input to an input terminal 123, and an output signal OUT is output from an output terminal 124. A power source line 125 supplies a power source voltage $V_{DD}$, and a power source line 126 supplies a power source voltage $V_{SS}$, where $V_{SS}<V_{DD}$. The variable delay circuit includes p-channel MIS or MOS transistors 127 through 130, an inverter 131, an NPN transistor 132, a resistor 133 for drawing the base charge of the NPN transistor 132, an n-channel MIS or MOS transistor 134, an NPN transistor 135, and a resistor 136 for drawing the base charge of the NPN transistor 135 which are connected as shown. The transistors 127 through 130, the inverter 131, the NPN transistor 132 and the resistor 133 form a pull-up circuit. The transistors 134 and 135 and the resistor 136 form a pull-down circuit.

In a series circuit which is made up of the transistors 127 and 128, transistor 128 is connected to the second stage counted from the power source line 125. A gate of the transistor 128 is connected to the input terminal 122. On the other hand, in a series circuit which is made up of the transistors 129 and 130, transistor 129 is connected to the first stage counted from the power source line 125. A gate of the transistor 129 is connected to the input terminal 122. In other words, between the series circuit made up of the transistors 127 and 128 and the series circuit made up of the transistors 129 and 130, the gate of only one of the transistors connected to the same stage counted from the power source line 125 or the base of the NPN transistor 132 is connected to the input terminal 122.

On the other hand, in the series circuit which is made up of the transistors 127 and 128, a gate of the transistor 127 is connected to an output terminal of the inverter 131. In addition, in the series circuit which is made up of the transistors 129 and 130, a gate of the transistor 130 is connected to the input terminal 123 for receiving the selection signal S. In other words, one of the series circuit made up of the transistors 127 and 128 and the series circuit made up of the transistors 129 and 130 is selected and made active in response to the selection signal S, so as to select the pull-up circuit formed by the transistors 127, 128 and 132 and the resistor 133 or the pull-up circuit formed by the transistors 129, 130 and 132 and the resistor 133. This selection of the series circuits or, the pull-up circuits, forms a characterizing feature of this embodiment, and is used as one means of obtaining two kinds of delay times as will be described later.

Figure 36:
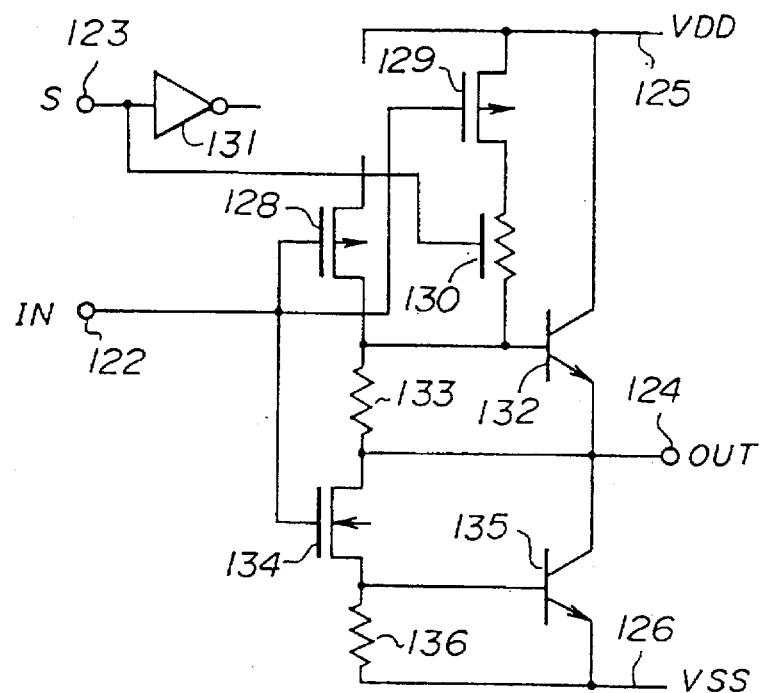
FIGS. 36 and 37 are circuit diagrams for explaining the operation of the eighth embodiment.
Figure 37:
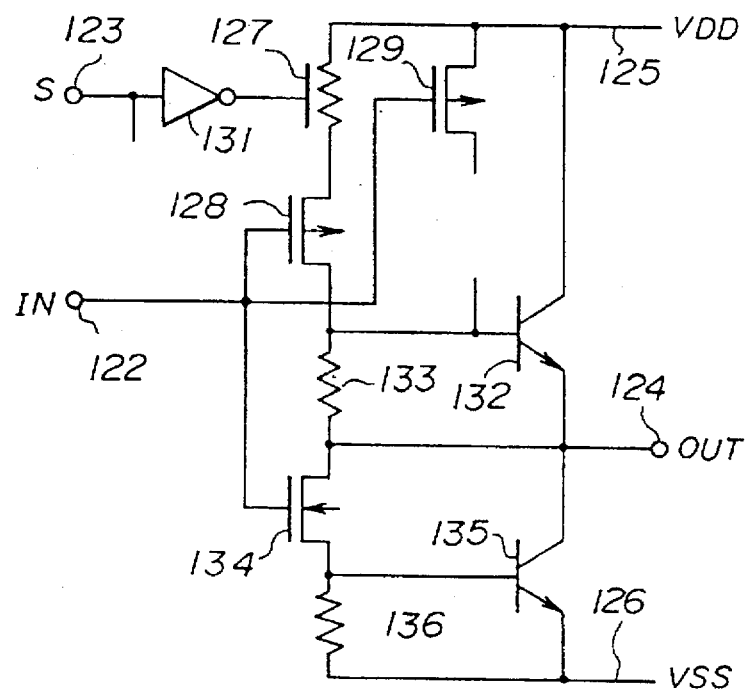
Figure 38:
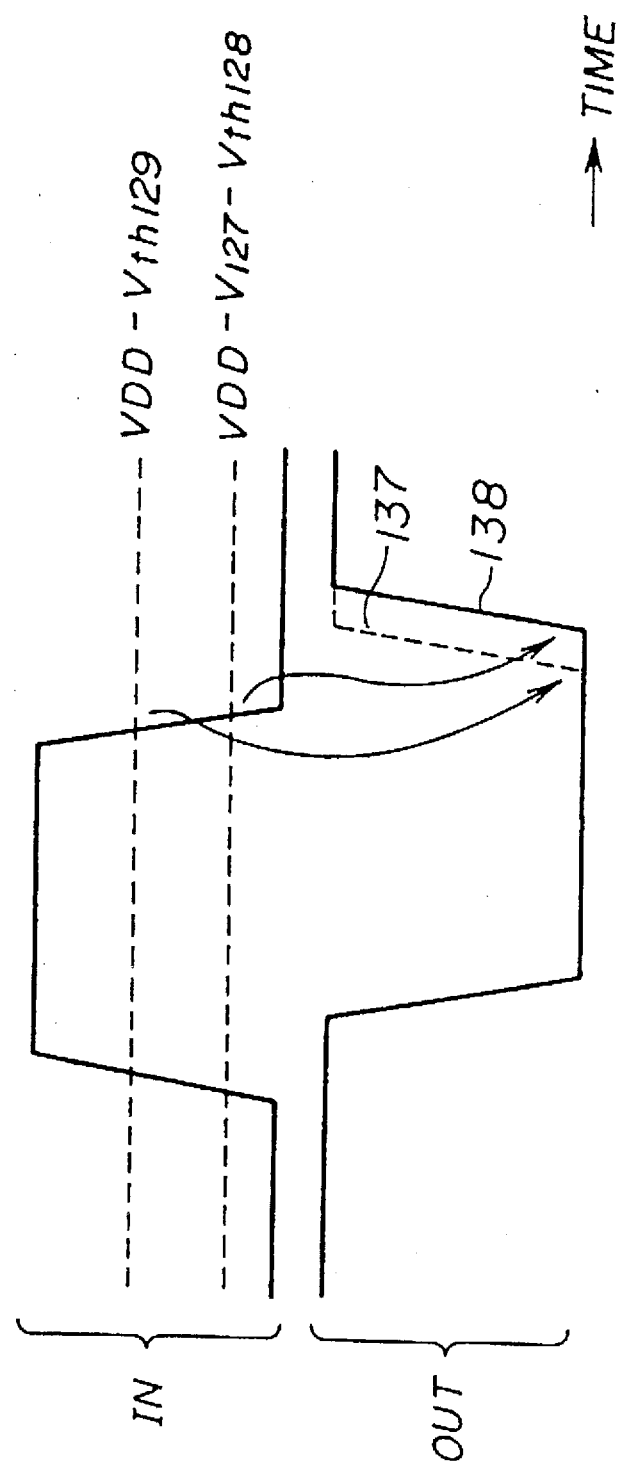
FIG. 38 is a time chart for explaining the operation of the eighth embodiment.

FIGS. 36 and 37 are circuit diagrams for explaining the operation of this embodiment, and FIG. 38 is a time chart for explaining the operation of this embodiment. In this embodiment, the transistor 127 becomes OFF and the transistor 130 becomes ON during a low-level period of the selection signal S.

FIG. 36 shows an equivalent circuit of this embodiment during the low-level period of the selection signal S, and in FIG. 36, the transistor 130 is shown as an ON-resistance.

In this case, if the input signal IN has a high level, the transistor 129 is OFF, the NPN transistor 132 is OFF, the transistor 134 is ON, the NPN transistor 135 is ON, and the output signal OUT has a low level. When the input signal IN undergoes a transition to a low level, the transistor 129 turns ON, the NPN transistor 132 turns ON, the transistor 134 turns OFF, the NPN transistor 135 turns OFF, and the output signal OUT is inverted from the low level to a high level.

The transistor 129 turns ON at the time when the input signal IN falls to a voltage $V_{DD}-V_{th129}$, where $V_{th129}$ denotes a threshold voltage of the transistor 129. In FIG. 38, a dotted line 137 shows the transition of the output signal OUT in this case.

On the other hand, the transistor 127 is ON and the transistor 130 is OFF during a high-level period of the selection signal S.

FIG. 37 shows an equivalent circuit of this embodiment during the high-level period of the selection signal S, and in FIG. 37, the transistor 127 is shown as an ON-resistance.

In this case, if the input signal IN has the high level, the transistor 128 is OFF, the NPN transistor 132 is OFF, the transistor 134 is ON, the NPN transistor 135 is ON and the output signal OUT has the low level. When the input signal IN undergoes a transition to the low level, the transistor 128 turns ON, the NPN transistor 132 turns ON, the transistor 134 turns OFF, the NPN transistor 135 turns OFF and the output signal OUT is inverted from the low level to the high level.

The transistor 128 turns ON at the time when the input signal IN falls to a voltage $V_{DD}-V_{127}-V_{th128}$, where $V_{127}$ denotes a voltage drop introduced by the ON-resistance of the transistor 127 and $V_{th128}$ denotes a threshold voltage of the transistor 128. In FIG. 38, a solid line 138 shows the transition of the output signal OUT in this case.

According to this eighth embodiment, it is possible to easily obtain two kinds of delay times having a fine time difference with respect to the low-level output signal OUT by the selection made in response to the selection signal S using a BiCMOS structure. Hence, this embodiment may be easily applied to a circuit for finely adjusting the delay time and the like.

Figure 2:
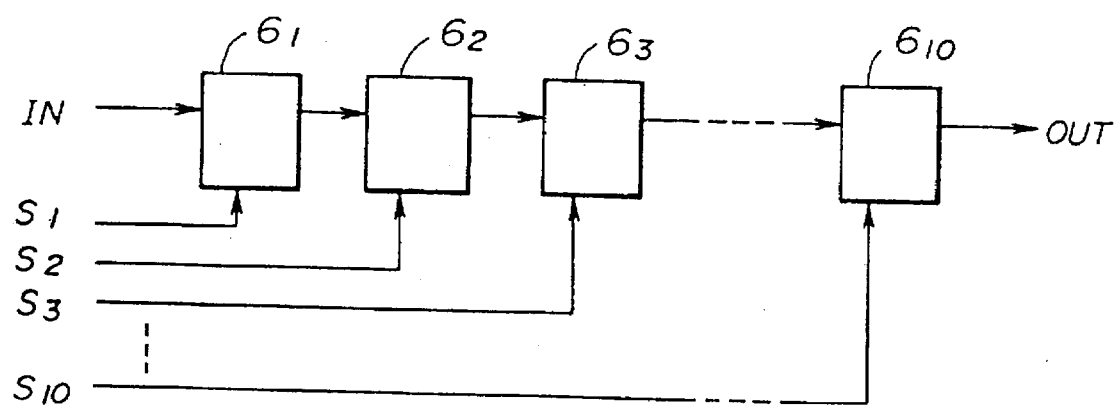
FIG. 2 is a system block diagram showing a circuit for finely adjusting the delay time made up of a plurality of variable delay circuits having the construction shown in FIG. 1.

Of course, a plurality of variable delay circuits having the construction described in any of the embodiments may be connected as shown in FIG. 2, for example, so as to obtain an arbitrary number of delay times having fine time differences. In addition, the present invention is also suited for obtaining the delay times having the fine time differences in a gate array circuit.

Further, the present invention is not limited to these embodiments, but various variations and modifications may be made without departing from the scope of the present invention.

What is claimed is:

1. A variable delay circuit comprising:
   a first power source line which supplies a first power source voltage;

a second power source line which supplies a second power source voltage that is lower than the first power source voltage;

an input terminal which receives an input signal;

selection terminal means for receiving a selection signal;

an output terminal;

a pull-up circuit which is coupled between the first power source line and the output terminal and performs a pull-up operation based on the input signal received by the input terminal, the pull-up circuit comprising a p-channel transistor coupled in series between the first power source line and the output terminal and having a gate coupled to the input terminal; and a pull-down circuit which is coupled between the output terminal and the second power source line and performs a pull-down operation based on the input signal received by the input terminal, the pull-down circuit having a variable threshold voltage and a delay time which is selectively variable by changing the threshold voltage in response to the selection signal received by the selection terminal means, to thereby provide an output signal at the output terminal which is delayed relative to the input signal, the pull-down circuit comprising N series circuits coupled in parallel between the output terminal and the second power source line, where N is an integer greater than or equal to two, each of the N series circuits including n-channel transistors connected in series in M stages which extend between the output terminal and the second power source line, where M is an integer greater than or equal to two, in each of the N series circuits, one of the n-channel transistors having a gate coupled to the input terminal and each of the remaining n-channel transistors within the series circuit having a gate coupled to the selection terminal means, and one of the N series circuits being selected in response to the selection signal to thereby determine the delay time of the pull-down circuit.

2. A variable delay circuit as in claim 1, wherein each series circuit of the N series circuits includes M n-channel transistors connected in series, a first series circuit of the N series circuits has a delay time determined by at least a threshold voltage of one of the n-channel transistors which form the first series circuit, and a second series circuit of the N series circuits has a delay time determined by a threshold voltage of one of the n-channel transistors which form the second series circuit and at least a voltage drop introduced by an ON-resistance of the remaining M−1 n-channel transistors which form the second series circuit.

3. A variable delay circuit as in claim 1, wherein the input signal has a falling edge and the output signal has a falling edge which corresponds to the falling edge of the input signal and is delayed relative to the falling edge of the input signal by the delay time of the pull-down circuit.

4. A variable delay circuit comprising:

a first power source line which supplies a first power source voltage;

a second power source line which supplies a second power source voltage that is lower than the first power source voltage;

an input terminal which receives an input signal;

selection terminal means for receiving a selection signal, the selection terminal means comprising N selection terminals which receive N selection signals, where the N selection signals respectively correspond on a one-to-one basis with the N selection terminals and N is an integer greater than or equal to two;

an output terminal;

a pull-up circuit which is coupled between the first power source line and the output terminal and performs a pull-up operation based on the input signal received by the input terminal, the pull-up circuit comprising a p-channel transistor coupled in series between the first power source line and the output terminal and having a gate coupled to the input terminal; and a pull-down circuit which is coupled between the output terminal and the second power source line and performs a pull-down operation based on the input signal received by the input terminal, the pull-down circuit having a variable threshold voltage and a delay time which is selectively variable by changing the threshold voltage in response to the selection signal received by the selection terminal means, to thereby provide an output signal at the output terminal which is delayed relative to the input signal, the pull-down circuit comprising N series circuits coupled in parallel between the output terminal and the second power source line, each of the N series circuits including n-channel transistors connected in series in M stages which extend between the output terminal and the second power source line, where M is an integer greater than or equal to two, each of the n-channel transistors having a respective gate, in each of the N series circuits, one of the n-channel transistors having a gate coupled to the input terminal and each of remaining n-channel transistors within the series circuit having a gate coupled in common with the gates of the other remaining n-channel transistors within the series circuit to a corresponding one of the N selection terminals, and one of the N series circuits being selected in response to the N selection signals to thereby determine the delay time of the pull-down circuit.

5. A variable delay circuit as in claim 4, wherein each series circuit of the N series circuits includes M n-channel transistors connected in series, a first series circuit of the N series circuits has a delay time determined by at least a threshold voltage of one of the n-channel transistors which form the first series circuit, and a second series circuit of the N series circuit has a delay time determined by a threshold voltage of one of the n-channel transistors which form the second series circuit and at least a voltage drop introduced by an ON-resistance of the remaining M−1 n-channel transistors which form the second series circuit.

6. A variable delay circuit as in claim 4, wherein the input signal has a falling edge and the output signal has a falling edge which corresponds to the falling edge of the input signal and is delayed relative to the falling edge of the input signal by the delay time of the pull-down circuit.

7. A variable delay circuit comprising:

a first power source line which supplies a first power source voltage;

a second power source line which supplies a second power source voltage that is lower than the first power source voltage;

an input terminal which receives an input signal;

selection terminals means for receiving a selection signal;

an output terminal for outputting an output signal which is delayed relative to the input signal;

a pull-up circuit which is coupled between the first power source line and the output terminal and performs a pull-up operation based on the input signal received by the input terminal, the pull-up circuit comprising N series circuits coupled in parallel between the first power source line and the output terminal, where N is an integer greater than or equal to two, each of the N series circuits including p-channel transistors connected in series in M stages extending between the first power source line and the output terminal, where M is an integer greater than or equal to two, in each of the N series circuits, one of the p-channel transistors having a gate coupled to the input terminal and each of the remaining p-channel transistors within the series circuit having a gate coupled to the selection terminal means, one of the N series circuits being selected in response to the selection signal to thereby determine the delay time of the pull-up circuit; and a pull-down circuit which is coupled between the output terminal and the second power source line and performs a pull-down operation based on the input signal received by the input terminal, the pull-down circuit comprising an n-channel transistor coupled in series between the output terminal and the second power source line and having a gate coupled to the input terminal;

wherein the pull-up circuit has a variable threshold voltage and a delay time which is selectively variable by changing the threshold voltage in response to the selection signal received by the selection terminal means, to thereby provide an output signal at the output terminal which is delayed relative to the input signal.

8. A variable delay circuit as in claim 7, wherein each series circuit of the N series circuits includes M p-channel transistors connected in series, a first series circuit of the N series circuits has a delay time determined by the first power source voltage and at least a threshold voltage of one of the p-channel transistors which form the first series circuit, and a second series circuit of the N series circuits has a delay time determined by the first power source voltage, a threshold voltage of one of the p-channel transistors which form the second series circuit and at least a voltage drop introduced by an ON-resistance of the remaining M−1 p-channel transistors which form the second series circuit.

9. A variable delay circuit as in claim 7, wherein the input signal has a rising edge and the output signal has a rising edge which corresponds to the rising edge of the input signal and is delayed relative to the rising edge of the input signal by the delay time of the pull-up circuit.

10. A variable delay circuit comprising:

a first power source line which supplies a first power source voltage;

a second power source line which supplies a second power source voltage that is lower than the first power source voltage;

an input terminal which receives an input signal;

selection terminals means for receiving a selection signal, the selection terminals means comprising N selection terminals which receive N selection signals, where the N selection signals respectively correspond on a one-to-one basis with the N selection terminals and N is an integer greater than or equal to two;

an output terminal for outputting an output signal which is delayed relative to the input signal;

a pull-up circuit which is coupled between the first power source line and the output terminal and performs a pull-up operation based on the input signal received by the input terminal, the pull-up circuit comprising N series circuits coupled in parallel between the first power source line and the output terminal, each of the N series circuits including p-channel transistors connected in series in M stages extending between the first power source line and the output terminal, where M is an integer greater than or equal to two, each of the p-channel transistors having a respective gate, in each of the N series circuits, one of the p-channel transistors having a gate coupled to the input terminal and each of the remaining p-channel transistors within the series circuit having a gate coupled in common with the gates of the other remaining p-channel transistors within the series circuit to a corresponding one of the N selection terminals, one of the N series circuits being selected in response to the N selection signals to thereby determine the delay time of the pull-up circuit; and a pull-down circuit which is coupled between the output terminal and the second power source line and performs a pull-down operation based on the input signal received by the input terminal, the pull-down circuit comprising an n-channel transistor coupled in series between the output terminal and the second power source line and having a gate coupled to the input terminal;

wherein the pull-up circuit has a variable threshold voltage and a delay time which is selectively variable by changing the threshold voltage in response to the selection signal received by the selection terminal means, to thereby provide an output signal at the output terminal which is delayed relative to the input signal.

11. A variable delay circuit as in claim 10, wherein each series circuit of the N series circuits includes M p-channel transistors connected in series, a first series circuit of the N series circuits has a delay time determined by the first power source voltage and at least a threshold voltage of one of the p-channel transistors which form the first series circuit, and a second series circuit of the N series circuits has a delay time determined by the first power source voltage, a threshold voltage of one of the p-channel transistors which form the second series circuit and at least a voltage drop introduced by an ON-resistance of the remaining M−1 p-channel transistors which form the second series circuit.

12. A variable delay circuit as in claim 10, wherein the input signal has a rising edge and the output signal has a rising edge which corresponds to the rising edge of the input signal and is delayed relative to the rising edge of the input signal by the delay time of the pull-up circuit.

13. A variable delay circuit which receives a selection signal and an input signal, comprising:

a pull-down circuit which includes N series circuits coupled in parallel with each other, each series circuit of the N series circuits including M transistors connected in series, where N and M are both integers greater than or equal to two, the selection signal selecting a respective series circuit of the N series circuits and causing each of the M transistors of the selected series circuit to be active and at least one transistor of the M transistors in each of the remaining (N−1) series circuits to be inactive, wherein the pull-down circuit pulls down the input signal with a variable delay time determined in accordance with the selected series circuit.

14. A variable delay circuit as in claim 13, wherein, in each series circuit of the N series circuits, one of the M transistors of the respective series circuit has a gate coupled to the input signal and each of the remaining (M—1) transistors within the respective series circuit has a gate coupled to the selection signal.

15. A variable delay circuit which receives a selection signal and an input signal, comprising:

a pull-up circuit which includes N series circuits coupled in parallel with each other, each series circuit of the N series circuits including M transistors connected in series, where N and M are both integers greater than or equal to two, the selection signal selecting a respective series circuit of the N series circuits and causing each of the M transistors of the selected series circuit to be active and at least one transistor of the M transistors in each of the remaining (N−1) series circuits to be inactive, wherein the pull-up circuit pulls up the input signal with a variable delay time determined in accordance with the selected series circuit.

16. A variable delay circuit as in claim 15, wherein, in each series circuit of the N series circuits, one of the M transistors of the respective series circuit has a gate coupled to the input signal and each of the remaining (M−1) transistors within the respective series circuit has a gate coupled to the selection signal.

* * * * *

UNITED STATES PATENT AND TRADEMARK OFFICE
CERTIFICATE OF CORRECTION

PATENT NO. : 5,684,423
DATED : November 4, 1997
INVENTOR(S) : KOYASHIKI et al.

It is certified that error appears in the above-identified patent and that said Letters Patent is hereby corrected as shown below:

Title Page, [75] change "Akishima" to --Tokyo--.
 [22] change "May 28, 1996" to --December 13, 1996--.

Col. 4, line 47, delete " ' ".

Col. 7, line 31, change "Signal" to --signal--.

Col. 8, line 29, change "Vth53" to --$V_{th63}$--.

Signed and Sealed this

Third Day of February, 1998

BRUCE LEHMAN

Attest:

Attesting Officer

Commissioner of Patents and Trademarks